United States Patent
Lee et al.

(10) Patent No.: US 11,043,441 B2
(45) Date of Patent: Jun. 22, 2021

(54) FAN-OUT SEMICONDUCTOR PACKAGE

(71) Applicant: SAMSUNG ELECTRONICS CO., LTD., Suwon-si (KR)

(72) Inventors: Doo Hwan Lee, Suwon-si (KR); Tae Je Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 83 days.

(21) Appl. No.: 16/211,928

(22) Filed: Dec. 6, 2018

(65) Prior Publication Data
US 2020/0066613 A1    Feb. 27, 2020

(30) Foreign Application Priority Data
Aug. 27, 2018 (KR) .................. 10-2018-0100198

(51) Int. Cl.
*H01L 23/367* (2006.01)
*H01L 23/31* (2006.01)
(Continued)

(52) U.S. Cl.
CPC ...... *H01L 23/3677* (2013.01); *H01L 21/4853* (2013.01); *H01L 21/4857* (2013.01);
(Continued)

(58) Field of Classification Search
CPC ............. H01L 23/5386; H01L 23/5389; H01L 23/3677; H01L 23/4334; H01L 2924/3511;
(Continued)

(56) References Cited

U.S. PATENT DOCUMENTS

2004/0160751 A1* 8/2004 Inagaki ................. H05K 1/181
                                                       361/763
2010/0025082 A1* 2/2010 Sasaoka ............... H05K 1/0206
                                                       174/252
(Continued)

FOREIGN PATENT DOCUMENTS

JP    2008177552 A    7/2008
JP     20124505 A     1/2012
(Continued)

OTHER PUBLICATIONS

Communication dated Feb. 25, 2020 from the Japanese Patent Office in application No. 2018-236620.
(Continued)

*Primary Examiner* — Amar Movva
(74) *Attorney, Agent, or Firm* — Sughrue Mion, PLLC

(57) ABSTRACT

A semiconductor package includes: a semiconductor chip having an active surface, having connection pads disposed thereon, and an inactive surface, opposing the active surface; an encapsulant covering the inactive surface of the semiconductor chip; a thermally conductive via penetrating through at least a portion of the encapsulant on the inactive surface of the semiconductor chip and physically spaced apart from the inactive surface of the semiconductor chip; and a connection structure disposed on the active surface of the semiconductor chip and including a redistribution layer electrically connected to the connection pads.

28 Claims, 21 Drawing Sheets

(51) Int. Cl.
  *H01L 23/538* (2006.01)
  *H01L 23/00* (2006.01)
  *H01L 21/48* (2006.01)

(52) U.S. Cl.
  CPC ...... *H01L 23/3128* (2013.01); *H01L 23/5386* (2013.01); *H01L 23/5389* (2013.01); *H01L 24/19* (2013.01); *H01L 24/20* (2013.01); *H01L 2225/1094* (2013.01); *H01L 2924/3511* (2013.01)

(58) Field of Classification Search
  CPC ....... H01L 2225/1094; H01L 23/49568; H01L 21/76877–76883
  See application file for complete search history.

(56) References Cited

U.S. PATENT DOCUMENTS

| | | | |
|---|---|---|---|
| 2011/0266666 A1* | 11/2011 | Maeda | H01L 24/19 257/698 |
| 2011/0309498 A1 | 12/2011 | Yamano | |
| 2017/0125318 A1 | 5/2017 | Harr et al. | |
| 2017/0207204 A1 | 7/2017 | Lin et al. | |
| 2017/0287856 A1 | 10/2017 | Lee et al. | |
| 2017/0309571 A1 | 10/2017 | Yi et al. | |
| 2017/0346185 A1 | 11/2017 | Wang et al. | |
| 2018/0053732 A1 | 2/2018 | Baek et al. | |
| 2018/0063961 A1 | 3/2018 | Kim et al. | |
| 2018/0096927 A1 | 4/2018 | Kim et al. | |
| 2018/0197831 A1 | 7/2018 | Kim et al. | |
| 2019/0139853 A1 | 5/2019 | Oh et al. | |

FOREIGN PATENT DOCUMENTS

| | | |
|---|---|---|
| JP | 201987731 A | 6/2019 |
| KR | 10-2009-0091333 A | 8/2009 |
| KR | 1020170051968 A | 5/2017 |
| KR | 10-2017-0121671 A | 11/2017 |
| KR | 10-2018-0020849 A | 2/2018 |
| KR | 1020180023384 A | 3/2018 |
| KR | 10-2018-0037406 A | 4/2018 |
| KR | 10-2018-0082849 A | 7/2018 |
| TW | 201725769 A | 7/2017 |
| TW | 201742310 A | 12/2017 |
| TW | 201801268 A | 1/2018 |
| TW | 201807793 A | 3/2018 |

OTHER PUBLICATIONS

Communication dated Dec. 10, 2019, issued by the Taiwan Patent Office in counterpart Taiwan Application No. 107144897.
Communication dated Jan. 20, 2020, issued by the Korean Intellectual Property Office in corresponding Korean Application No. 10-2018-0100198.
Communication dated Jun. 12, 2019 issued by the Taiwan Intellectual Property Office in counterpart Taiwan Application No. 107144897.

* cited by examiner

I-I'

US 11,043,441 B2

FAN-OUT SEMICONDUCTOR PACKAGE

CROSS-REFERENCE TO RELATED APPLICATION(S)

This application claims benefit of priority to Korean Patent Application No. 10-2018-0100198 filed on Aug. 27, 2018 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing electrical connection structures outwardly of a region in which a semiconductor chip is disposed.

Meanwhile, the fan-out package has recently been required to have improved heat dissipation characteristics.

SUMMARY

An aspect of the present disclosure may provide a fan-out semiconductor package in which heat dissipation characteristics may be excellent, a warpage problem and a reliability problem may be solved, and process costs may be reduced.

According to an aspect of the present disclosure, a fan-out semiconductor package may be provided, in which a conductive via penetrating through at least a portion of an encapsulant and physically spaced apart from an inactive surface of a semiconductor chip is formed on the inactive surface of the semiconductor chip.

According to an aspect of the present disclosure, a semiconductor package may include: a semiconductor chip having an active surface, having connection pads disposed thereon, and an inactive surface, opposing the active surface; an encapsulant covering the inactive surface of the semiconductor chip; a thermally conductive via penetrating through at least a portion of the encapsulant on the inactive surface of the semiconductor chip and physically spaced apart from the inactive surface of the semiconductor chip; and a connection structure disposed on the active surface of the semiconductor chip and including a redistribution layer electrically connected to the connection pads.

According to an aspect of the present disclosure, a semiconductor package may include: a semiconductor chip having an active surface, having connection pads disposed thereon, and an inactive surface, opposing the active surface; an encapsulant layer covering the semiconductor chip; a thermally conductive via penetrating into the encapsulant layer and spaced apart from the semiconductor chip only by a portion of the encapsulant layer disposed between the thermally conductive via and the semiconductor chip; and a connection structure disposed on the active surface of the semiconductor chip and including a redistribution layer electrically connected to the connection pads.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
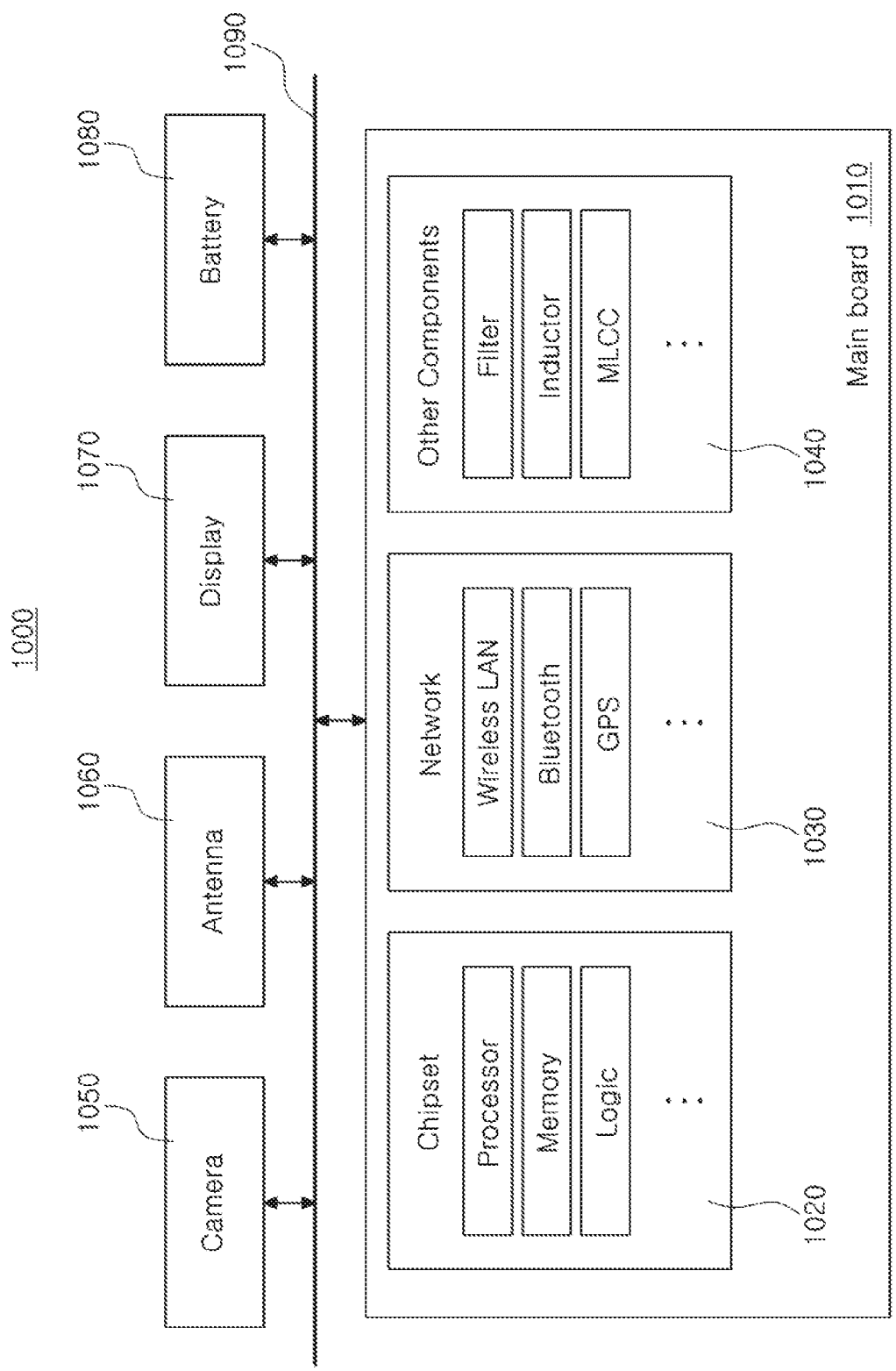
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
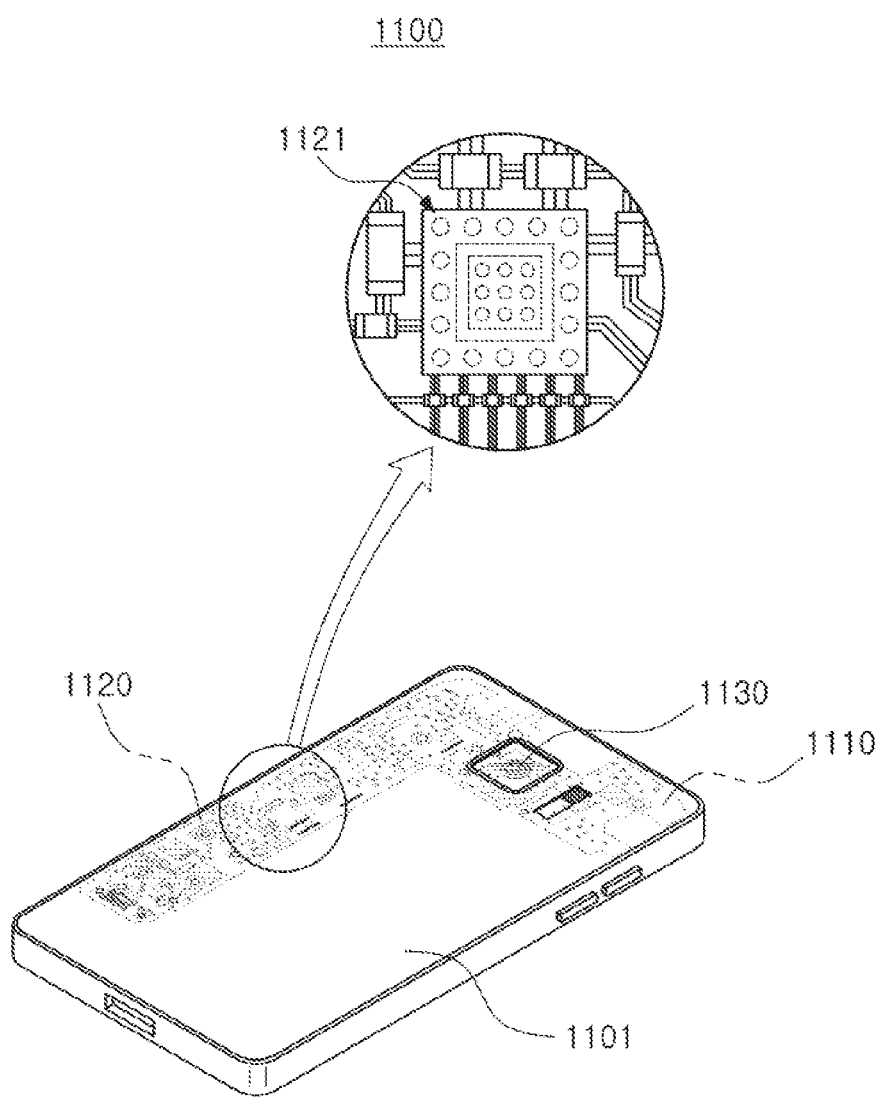
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
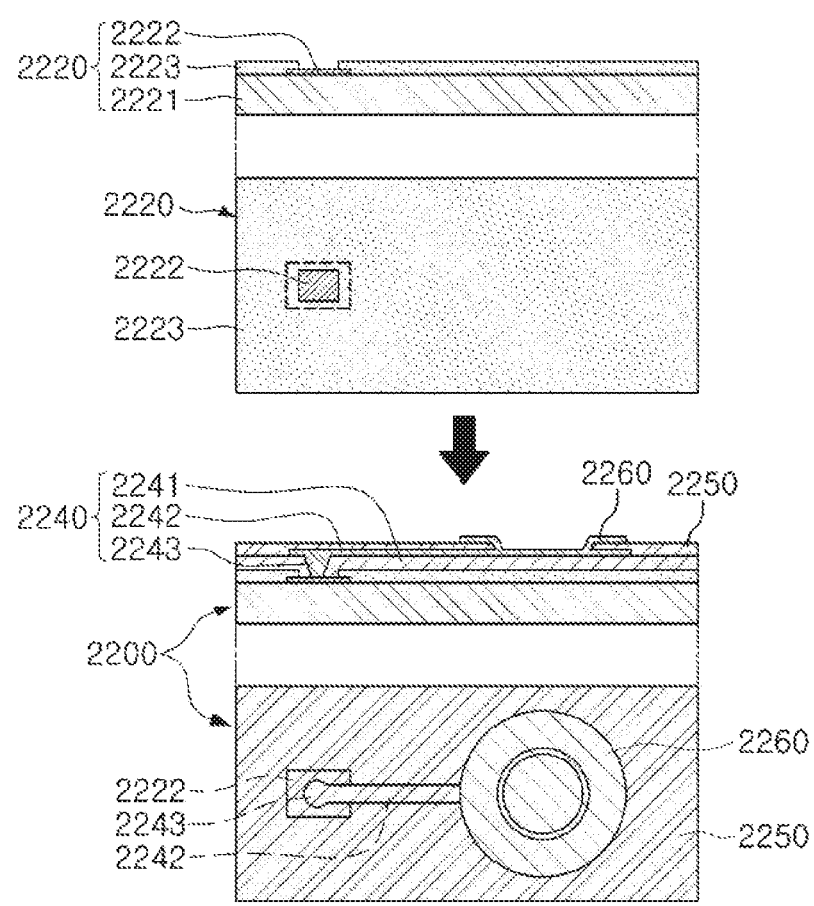
FIGS. 3A and 3B are schematic cross-sectional views illustrating states of a fan-in semiconductor package before and after being packaged.
Figure 3B:
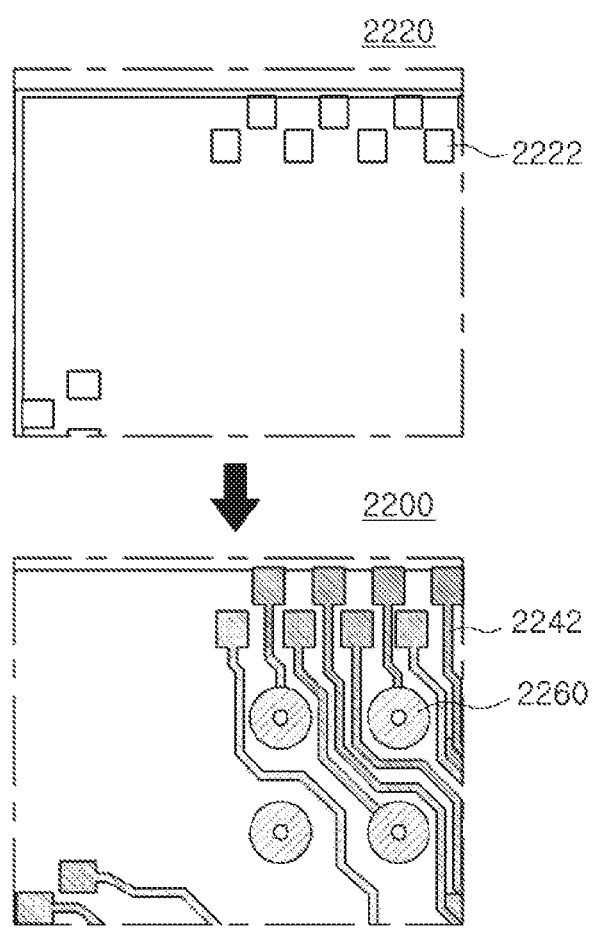

FIGS. 3A and 3B are schematic cross-sectional views illustrating states of a fan-in semiconductor package before and after being packaged.

Figure 4:
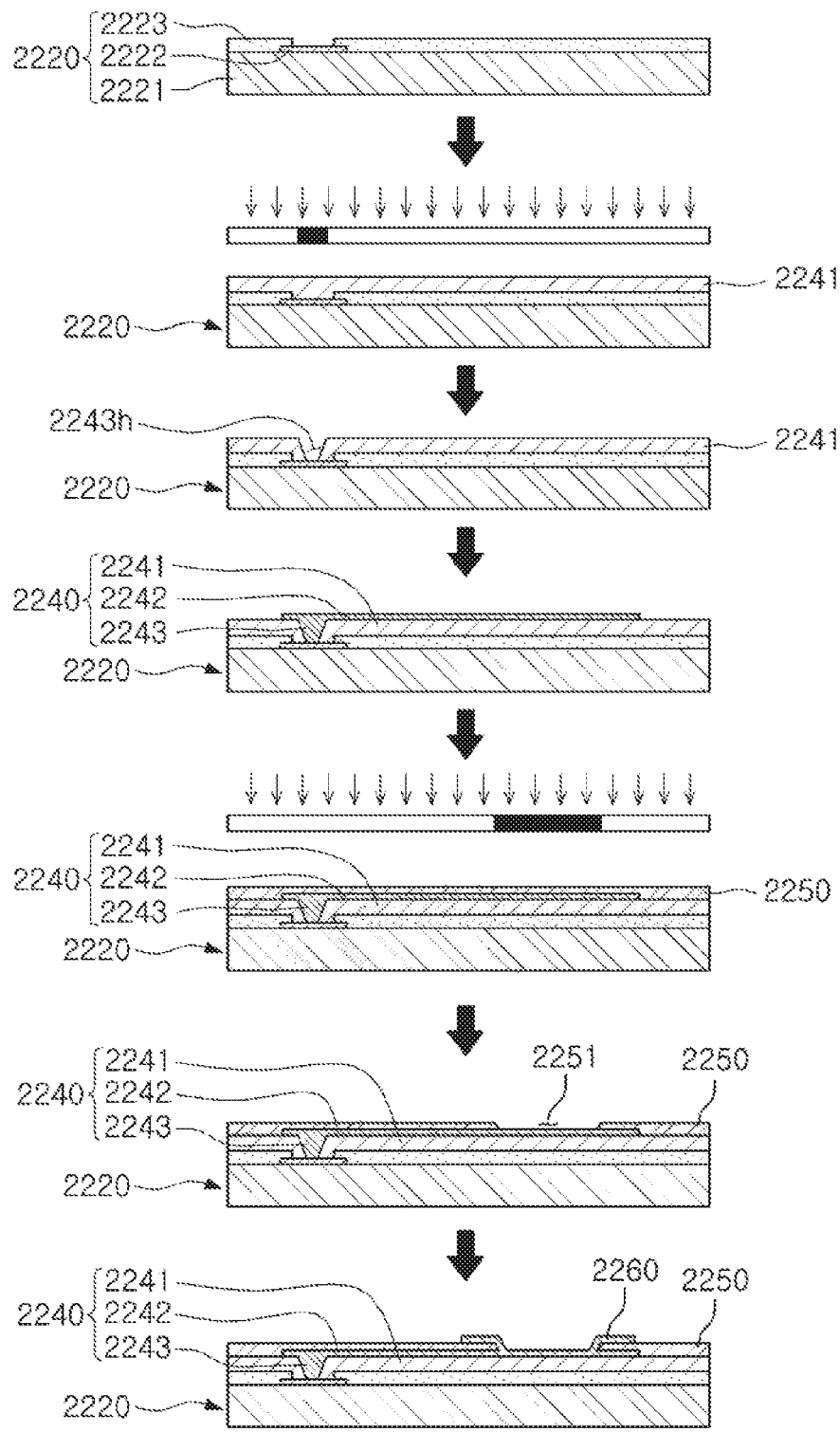
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
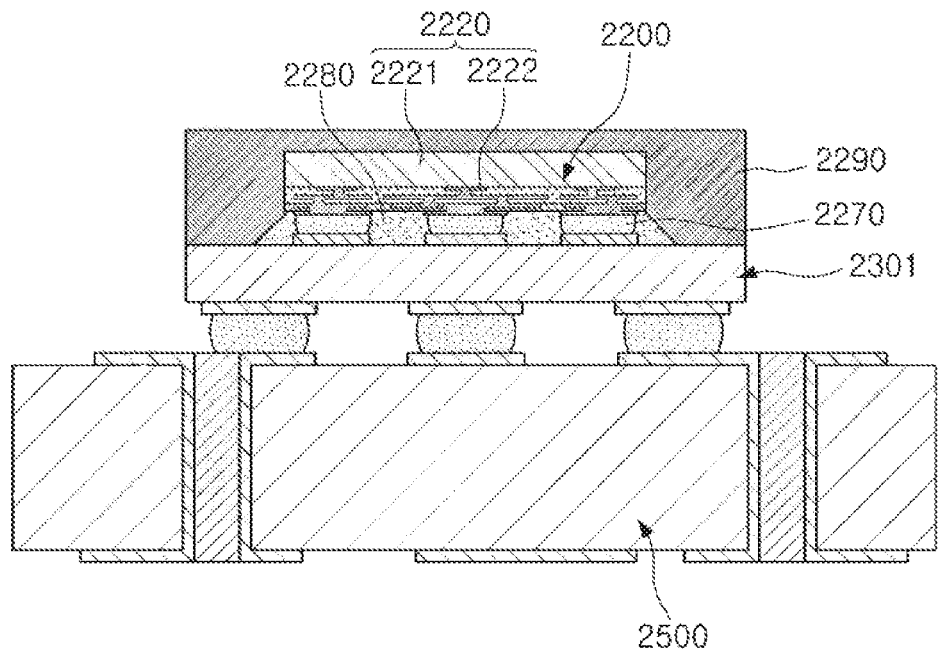
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
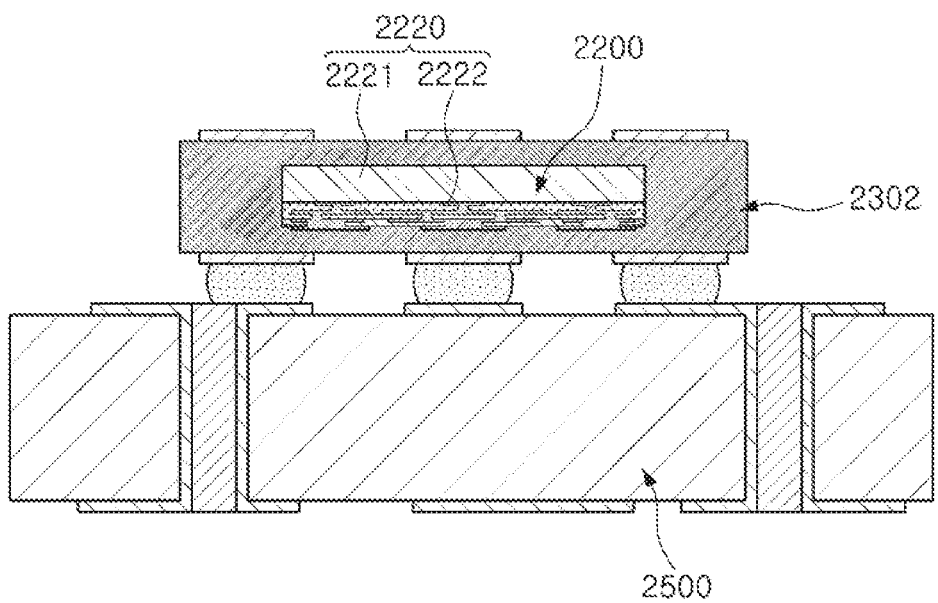
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
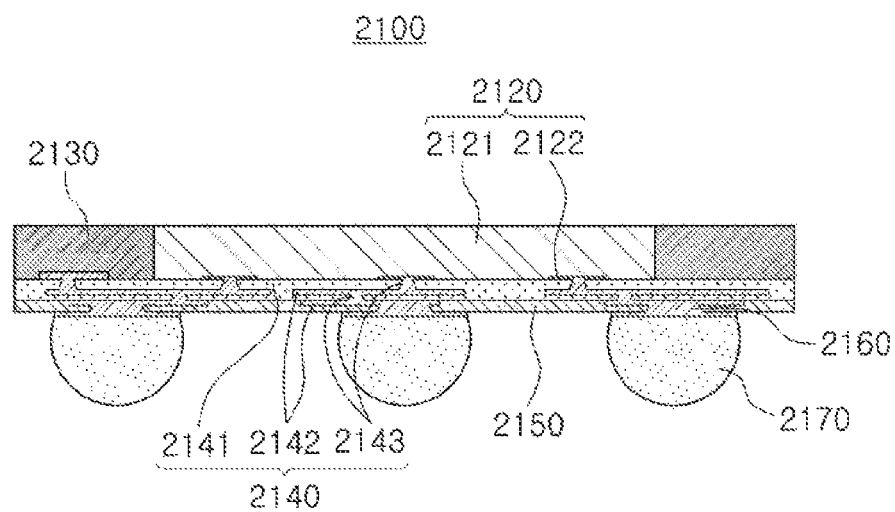
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
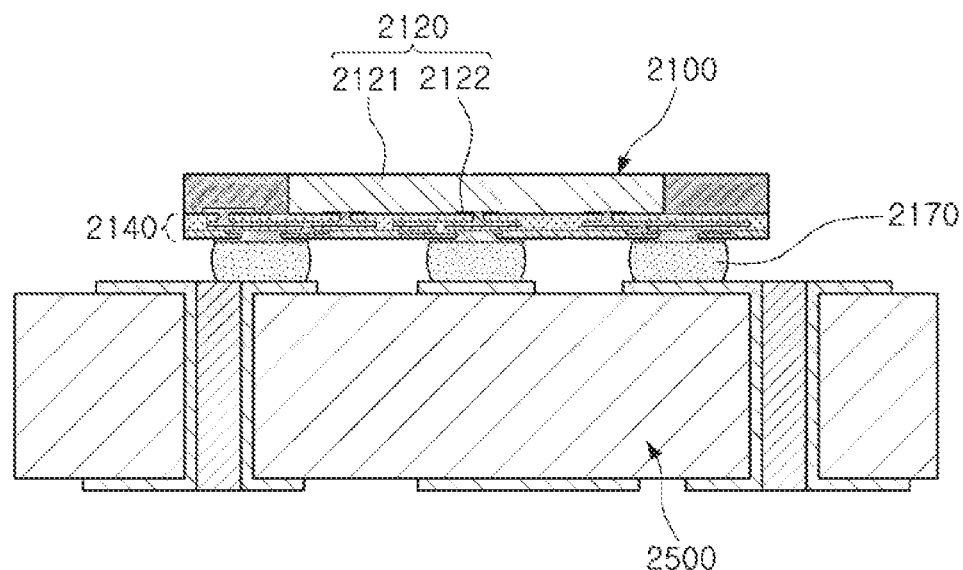
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which heat dissipation characteristics may be excellent, a warpage problem and a reliability problem may be solved, and process costs may be reduced will hereinafter be described with reference to the drawings.

Figure 9:
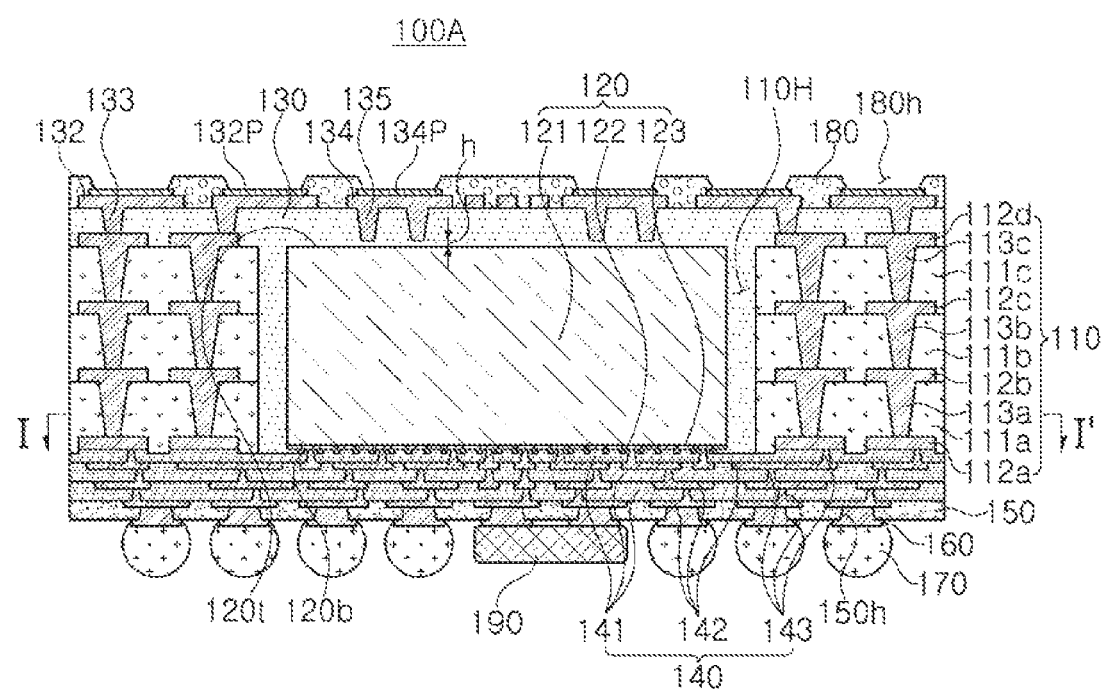
FIG. 9 is a schematic cross-sectional view illustrating a fan-out semiconductor package according to an exemplary embodiment in the present disclosure.

FIG. 9 is a schematic cross-sectional view illustrating a fan-out semiconductor package according to an exemplary embodiment in the present disclosure.

Figure 10:
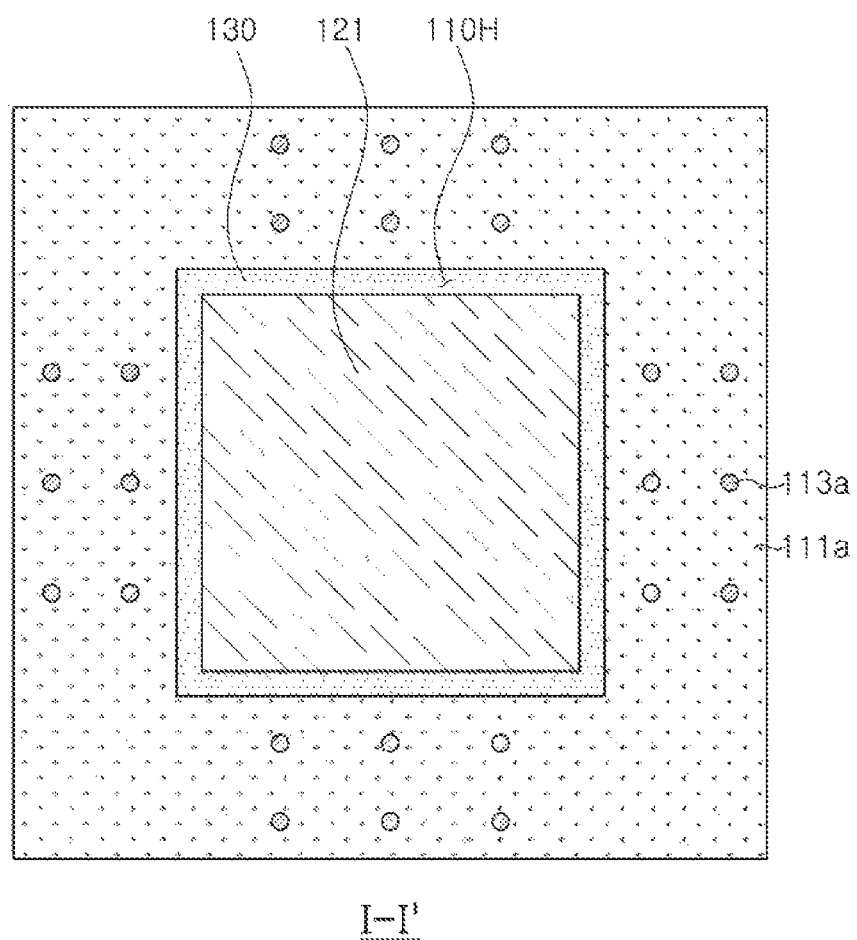
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to FIGS. 9 and 10, the fan-out semiconductor package 100A according to the exemplary embodiment may include a semiconductor chip 120 having an active surface 120b having connection pads 122 disposed thereon and an inactive surface 120t opposing the active surface 120b, an encapsulant 130 covering the inactive surface 120t of the semiconductor chip 120, thermally conductive vias 135 penetrating through at least portions of the encapsulant 130 on the inactive surface 120t of the semiconductor chip 120 and physically spaced apart from the inactive surface 120t of the semiconductor chip 120 by a predetermined distance h, a thermally conductive pattern layer 134 protruding on the encapsulant 130 and connected to the thermally conductive vias 135, and a connection structure 140 disposed on the active surface 120b of the semiconductor chip 120 and including redistribution layers 142 electrically connected to the connection pads 122 of the semiconductor chip 120. The fan-out semiconductor package 100A may further include a frame 110, a wiring pattern layer 132, wiring vias 133, a passivation layer 150, a surface mounting component 190, underbump metals 160, electrical connection structures 170, a cover layer 180, and the like.

In general, a fan-out semiconductor package has a structure in which a semiconductor chip is simply molded with and surrounded by an encapsulant such as an epoxy molding compound (EMC), or the like. In this case, most of the heat generated by the semiconductor chip is discharged downwardly along redistribution layers, and only a significantly small amount of heat is conducted to the encapsulant having low thermal conductivity, such that heat dissipation characteristics are deteriorated. Recently, in accordance with improvement of a function of a semiconductor chip, it has become important to effectively dissipate heat generated from the semiconductor chip. Therefore, in order to improve the heat dissipation characteristics, for example, it has been considered to promote heat dissipation by a method of attaching a heat dissipation member such as a metal plate or plating a metal layer onto a semiconductor package. However, also in this case, a distance between the heat dissipation member and the semiconductor chip is significant, and it is thus difficult to achieve a sufficient heat dissipation effect.

On the other hand, in the fan-out semiconductor package 100A according to the exemplary embodiment, the thermally conductive vias 135 penetrating through at least portions of the encapsulant 130 on the inactive surface 120t of the semiconductor chip 120 may be introduced. Since the thermally conductive vias 135 are disposed sufficiently close to the inactive surface 120t of the semiconductor chip 120, an excellent heat dissipation effect may be expected through the thermally conductive vias 135. When thermally conductive vias and an inactive surface of the semiconductor chip that are formed of heterogeneous materials are in direct contact with each other, warpage may be generated due to a mismatch between coefficients of thermal expansion (CTEs) of the conductive vias and the inactive surface of the semiconductor chip, and it may be necessary to perform special cleaning on and apply an adhesive material between the thermally conductive vias and the inactive surface of the semiconductor chip in order to secure interface adhesion between the thermally conductive vias and the inactive surface of the semiconductor chip. On the other hand, in the fan-out semiconductor package 100A according to the exemplary embodiment, the thermally conductive vias 135 may be physically spaced apart from the inactive surface 120t of the semiconductor chip 120, and a warpage control and a cost reduction as well as a heat dissipation effect may thus be possible. In addition, a region by which the thermally conductive via 135 is spaced apart from the inactive surface 120t of the semiconductor chip 120 may be filled with the encapsulant 130 rather than another separate material, such that a reliability problem may be solved and an additional cost may be reduced. Meanwhile, the distance h by which the inactive surface 120t of the semiconductor chip 120 and the thermally conductive via 135 are physically spaced apart from each other may be about 1 µm to 5 µm. When the distance h is less than 1 µm, a warpage control effect, or the like, may be reduced, and when the distance h exceeds 5 µm, a heat dissipation effect may be reduced.

Meanwhile, in the fan-out semiconductor package 100A according to the exemplary embodiment, the thermally conductive pattern layer 134 connected to the thermally conductive vias 135 may be disposed on the encapsulant 130. Therefore, heat generated from the inactive surface 120t of the semiconductor chip 120 may be transferred to the thermally conductive pattern layer 134 through the thermally conductive vias 135 to be easily dissipated upwardly of the fan-out semiconductor package 100A. Meanwhile, the thermally conductive pattern layer 134 and the thermally conductive via 135 may be integrated with each other without having a boundary therebetween. That is, the thermally conductive pattern layer 134 and the thermally conductive via 135 may be simultaneously formed by a plating process, as can be seen from a process to be described below. Therefore, a problem of close adhesion or a problem of reliability between the thermally conductive pattern layer 134 and the thermally conductive via 135 may be easily solved.

Meanwhile, in the fan-out semiconductor package 100A according to the exemplary embodiment, a material having high thermal conductivity may be used as a material of the encapsulant 130. For example, thermal conductivity of the encapsulant 130 may be 0.50 W/m° C. or more, preferably, about 0.60 to 0.80 W/m° C. The thermal conductivity of the encapsulant 130 may be greater than that of an insulating layer 141 of the connection structure 140. In this case, heat generated from the semiconductor chip 120 may be effectively transferred to the thermally conductive via 135 and the thermally conductive pattern layer 134 through the encapsulant 130. A material of the encapsulant 130 may be an insulating resin and an inorganic filler. In this case, a content of the inorganic filler may be approximately 60 wt % or more, for example, 70 wt % to 90 wt %.

The respective components included in the fan-out semiconductor package 100A according to the exemplary embodiment will hereinafter be described in more detail.

The frame 110 may improve rigidity of the fan-out semiconductor package 100A depending on certain materials, and serve to secure uniformity of a thickness of the encapsulant 130. When wiring layers 112a, 112b, 112c, and 112d, wiring vias 113a, 113b, and 113c, and the like, are formed in the frame 110, the fan-out semiconductor package 100A may be utilized as a package-on-package (POP) type package. The frame 110 may have a through-hole 110H. The semiconductor chip 120 may be disposed in the through-hole 110H to be spaced apart from the frame 110 by a predetermined distance. Side surfaces of the semiconductor chip 120 may be surrounded by the frame 110. However, such a form is only an example and may be variously modified to have other forms, and the frame 110 may perform another function depending on such a form.

The frame 110 may include a first insulating layer 111a in contact with the connection structure 140, a first wiring layer 112a in contact with the connection structure 140 and embedded in the first insulating layer 111a, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, a third wiring layer 112c disposed on the second insulating layer 111b, a third insulating layer 111c disposed on the second insulating layer 111b and covering the third wiring layer 112c, and a fourth wiring layer 112d disposed on the third insulating layer 111c. The first to fourth wiring layers 112a, 112b, 112c, and 112d may be electrically connected to the connection pads 122. The first to fourth wiring layers 112a, 112b, 112c, and 112d may be electrically connected to each other through first to third wiring vias 113a, 113b, and 113c respectively penetrating through the first to third insulating layers 111a, 111b, and 111c.

When the first wiring layer 112a is embedded in the first insulating layer 111a, a step generated due to a thickness of the first wiring layer 112a may be significantly reduced, and an insulating distance of the connection structure 140 may thus become more constant. The first wiring layer 112a may be recessed in the first insulating layer 111a, such that a lower surface of the first insulating layer 111a and a lower surface of the first wiring layer 112a may have a step therebetween. In this case, a phenomenon in which a material of the encapsulant 130 bleeds to pollute the first wiring layer 112a may be prevented. The second and third wiring layers 112b and 112c may be disposed on a level between the active surface and the inactive surface of the semiconductor chip 120. The frame 110 may be manufactured at a sufficient thickness by a substrate process, or the like, while the connection structure 140 may be manufactured at a small thickness by a semiconductor process, or the like. Therefore, a thickness of each of the wiring layers 112a, 112b, 112c, and 112d of the frame 110 may be greater than that of each of the redistribution layers 142 of the connection structure 140.

A material of each of the insulating layers 111a, 111b, and 111c is not particularly limited. For example, an insulating material may be used as the material of each of the insulating layers 111a, 111b, and 111c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material. In terms of maintenance of rigidity, the prepreg may be used as the material of each of the insulating layers 111a, 111b, and 111c.

The wiring layers 112a, 112b, 112c, and 112d may serve to redistribute the connection pads 122 of the semiconductor chip 120. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include via pads, wire pads, electrical connection structure pads, and the like.

The wiring vias 113a, 113b, and 113c may electrically connect the wiring layers 112a, 112b, 112c, and 112d formed on different layers to each other, resulting in an electrical path in the frame 110. A material of each of the wiring vias 113a, 113b, and 113c may be a conductive material. Each of the wiring vias 113a, 113b, and 113c may be a filled-type via completely filled with the conductive material, or may be a conformal-type via in which the conductive material is formed along a wall of each of via holes. Meanwhile, for the reason in a process, the wiring vias 113a, 113b, and 113c may have tapered shapes of which directions are the same as each other, that is, tapered shapes of which widths of upper portions are greater than those of lower portions, in relation to a cross section. For the reason in a process, the wiring vias 113a, 113b, and 113c may be integrated with the wiring layers 112a, 112b, 112c, and 112d, respectively.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. For example, the IC may be a memory chip such as a volatile memory (for example, a DRAM), a non-volatile memory (for example, a ROM), a flash memory, or the like, a logic chip such as an analog-to-digital converter, an application-specific IC (ASIC), or the like, or another kind of IC such as a power management IC (PMIC). Alternatively, some of these elements may be combined with one another.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), copper (Cu), or the like. A passivation layer 123 opening the connection pads 122 may be formed on an active surface of the body 121, and may be an oxide layer, a nitride layer, or the like, or a double layer of an oxide layer and a nitride layer. A lower surface of the connection pad 122 may have a step with respect to a lower surface of the encapsulant 130 through the passivation layer 123. Therefore, the encapsulant 130 may fill at least portions of a space between the passivation layer 123 and the connection structure 140. In this case, a phenomenon in which the encapsulant 130 bleeds into the lower surface of the connection pad 122 may be prevented to some degree. An insulating layer (not illustrated), and the like, may also be further disposed in other required positions. The semiconductor chip 120 may be a bare die. Therefore, the connection pads 122 may be in physical contact with connection vias 143 of the connection structure 140. However, depending on a kind of semiconductor chip 120, a separate redistribution layer (not illustrated) may further be formed on the active surface of the semiconductor chip 120, and the semiconductor chip 120 may have a packaged form in which bumps (not illustrated), or the like, are connected to the connection pads 122. Meanwhile, the active surface 120b of the semiconductor chip 120 refers to a surface on which the connection pads 122 are disposed, and the inactive surface 120t of the semiconductor chip 120 refers to a surface opposing the active surface.

The encapsulant 130 may protect the frame 110, the semiconductor chip 120, and the like. An encapsulation form of the encapsulant 130 is not particularly limited, but may be a form in which the encapsulant 130 surrounds at least portions of each of the frame 110 and the semiconductor chip 120. For example, the encapsulant 130 may cover the frame 110 and the inactive surface of the semiconductor chip 120, and fill at least portions of the through-hole 110H. The encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used.

The encapsulant 130 may have high thermal conductivity. For example, thermal conductivity of the encapsulant 130 may be 0.50 W/m° C. or more, preferably, about 0.60 to 0.80

W/m° C. The thermal conductivity of the encapsulant 130 may be greater than that of an insulating layer 141 of the connection structure 140. In this case, heat generated from the semiconductor chip 120 may be effectively transferred to the thermally conductive via 135 and the thermally conductive pattern layer 134 through the encapsulant 130. A material of the encapsulant 130 may be an insulating resin and an inorganic filler. In this case, a content of the inorganic filler may be approximately 60 wt % or more, for example, 70 wt % to 90 wt %.

The thermally conductive vias 135 may penetrate through at least portions of the encapsulant 130 on the inactive surface 120t of the semiconductor chip 120, and may be physically spaced apart from the inactive surface 120t of the semiconductor chip 120 by a predetermined distance h. The distance h by which the inactive surface 120t of the semiconductor chip 120 and the thermally conductive via 135 are physically spaced apart from each other may be about 1 μm to 5 μm, and at least portions of the region in which the thermally conductive via 135 is spaced apart from the inactive surface 120t of the semiconductor chip 120 may be filled with the encapsulant 130. The thermally conductive vias 135 may be physically spaced apart from the inactive surface 120t of the semiconductor chip 120 only by the portion of the encapsulant 130 filling therebetween. The thermally conductive pattern layer 134 may protrude on the encapsulant 130, and may be connected to the thermally conductive via 135. The thermally conductive pattern layer 134 and the thermally conductive via 135 may be integrated with each other without having a boundary therebetween. The thermally conductive pattern layer 134 and the thermally conductive via 135 may include a conductive material, more specifically, a metal, such as a conductive material such as copper (Cu), aluminum (Al), silver (Ag), tin (Sn), gold (Au), nickel (Ni), lead (Pb), titanium (Ti), or alloys thereof. The thermally conductive pattern layer 134 and the thermally conductive via 135 may be a plurality of conductor layers including a seed layer and a plating layer. The thermally conductive pattern layer 134 and the thermally conductive via 135 may have a layer formed of only a metal. The thermally conductive via 135 may have a tapered shape of which a width of a cross section becomes narrow toward the inactive surface 120t of the semiconductor chip 120, that is, a width of an upper surface is greater than that of a lower surface, in relation to a cross section. The thermally conductive pattern layer 134 may have a plate shape, and may function as ground and/or power patterns to be electrically connected to the ground and/or power patterns of the wiring layers 112a, 112b, 112c, and 112d of the frame 110, ground and/or power patterns of the redistribution layers 142 of the connection structure 140, and ground and/or power pads of the connection pads 122 of the semiconductor chip 120.

The wiring pattern layer 132 may be disposed side by side with the thermally conductive pattern layer 134 on the encapsulant 130. The wiring vias 133 may penetrate through at least portions of the encapsulant 130, and may electrically connect the fourth wiring layer 112d, which is the uppermost wiring layer of the frame 110, and the wiring pattern layer 132 to each other. An upper surface of the uppermost insulating layer of the frame 100 (e.g., the third insulating layer 111c) may be disposed on a level the same as or above a level of the active surface 120t of the semiconductor chip 120 with respect to the connection structure 140, and a thickness of the uppermost wiring layer of the frame (e.g., the fourth wiring layer 112d) may be greater than the distance h. As such, a thickness of the wiring vias 133 may be less than a thickness of the thermally conductive via 135.

A material of each of the wiring pattern layer 132 and the wiring via 133 may also be a conductive material, more specifically, a metal, such as a conductive material such as copper (Cu), aluminum (Al), silver (Ag), tin (Sn), gold (Au), nickel (Ni), lead (Pb), titanium (Ti), or alloys thereof. The wiring pattern layer 132 and the wiring via 133 may be a plurality of conductor layers including a seed layer and a plating layer. The wiring pattern layer 132 and the wiring via 133 may have a layer formed of only a metal. The wiring pattern layer 132 may perform various functions depending on a design. For example, the wiring pattern layer 132 may include ground (GND) patterns, power (PWR) patterns, signal (S) patterns, and the like. The wiring via 133 may also have a tapered shape of which a width of an upper surface is greater than that of a lower surface, in relation to a cross section, similar to the thermally conductive via 135.

The connection structure 140 may redistribute the connection pads 122 of the semiconductor chip 120. Several tens to several hundreds of connection pads 122 of the semiconductor chip 120 having various functions may be redistributed by the connection structure 140, and may be physically or electrically externally connected through the electrical connection structures 170 depending on functions. The connection structure 140 may include insulating layers 141 disposed on the frame 110 and the active surface of the semiconductor chip 120, the redistribution layers 142 disposed on the insulating layers 141, and the connection vias 143 penetrating through the insulating layers 141 and connecting the connection pads 122 and the redistribution layers 142 to each other. A case in which the connection structure 140 includes a plurality of insulating layers, a plurality of redistribution layers, and a plurality of via layers is illustrated in the drawings, but the connection structure 140 may include smaller numbers or larger numbers of insulating layers, redistribution layers, and via layers than those illustrated in the drawings depending on a design.

A material of each of the insulating layers 141 may be an insulating material. In this case, a photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the connection via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, a boundary between the insulating layers 141 may be apparent or may not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns.

The connection vias 143 may electrically connect the redistribution layers 142, the connection pads 122, and the like, formed on different layers to each other, resulting in an electrical path in the fan-out semiconductor package 100A. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be completely filled with the conductive material, or the conductive material may also be formed along a wall of each of via holes. Meanwhile, each of the connection vias 143 of the connection structure 140 may have a tapered shape of which a direction is opposite to that of each of the wiring vias 113a, 113b, and 113c of the frame 110. That is, each of the connection vias 143 of the connection structure 140 may have a tapered shape of which a width of an upper surface is smaller than that of a lower surface, in relation to a cross section.

The passivation layer 150 may protect the connection structure 140 from external physical or chemical damage. The passivation layer 150 may have openings 150h opening at least portions of the lowermost redistribution layer 142 of the connection structure 140. The number of openings 150h formed in the passivation layer 150 may be several tens to several thousands. A surface treatment layer (not illustrated) may be formed by plating such as noble metal plating on a surface of the opened redistribution layer 142. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metals 160 may improve connection reliability of the electrical connection structures 170 to improve board level reliability of the fan-out semiconductor package 100A. The underbump metals 160 may be connected to the redistribution layer 142 of the connection structure 140 opened through the openings 150h of the passivation layer 150. The underbump metals 160 may be formed in the openings 150h of the passivation layer 150 by any known metallization method using any known conductive metal such as a metal, but are not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a low melting point metal, for example, a solder such as tin (Sn)-aluminum (Al)-copper (Cu), or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metals 160 extending onto one surface of the passivation layer 150, and connection reliability may be more excellent. At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

The cover layer 180 may protect the thermally conductive pattern layer 134 and/or the wiring pattern layer 132 from external physical or chemical damage. The cover layer 180 may have openings 180h opening at least portions of the thermally conductive pattern layer 134 and/or the wiring pattern layer 132. The number of openings 180h formed in the cover layer 180 may be several tens to several thousands. Surface treatment layers 134P and 132P may be formed on opened surfaces of the thermally conductive pattern layer 134 and/or the wiring pattern layer 132, respectively. Each of the surface treatment layers 132P and 134P is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like. A material of the cover layer 180 is not particularly limited. For example, an insulating material may be used as the material of the cover layer 180. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The surface mounting component 190 may be mounted on a lower surface of the passivation layer 150 through surface mounting technology (SMT). The surface mounting component 190 may be any known passive component such as a capacitor, an inductor, or the like, but is not limited thereto. The surface mounting component 190 may be an active component, if necessary. The surface mounting components 190 may be electrically connected to the connection pads 122 of the semiconductor chip 120 through the redistribution layers 142 of the connection structure 140.

Meanwhile, although not illustrated, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, the number of through-holes 110H may be plural, if necessary, and the semiconductor chips 120 and/or passive components may be disposed in the through-holes 110H, respectively. In addition, a metal layer may be formed on the walls of the through-hole 110H, if necessary, in order to dissipate heat and block electromagnetic waves.

Figure 11A:
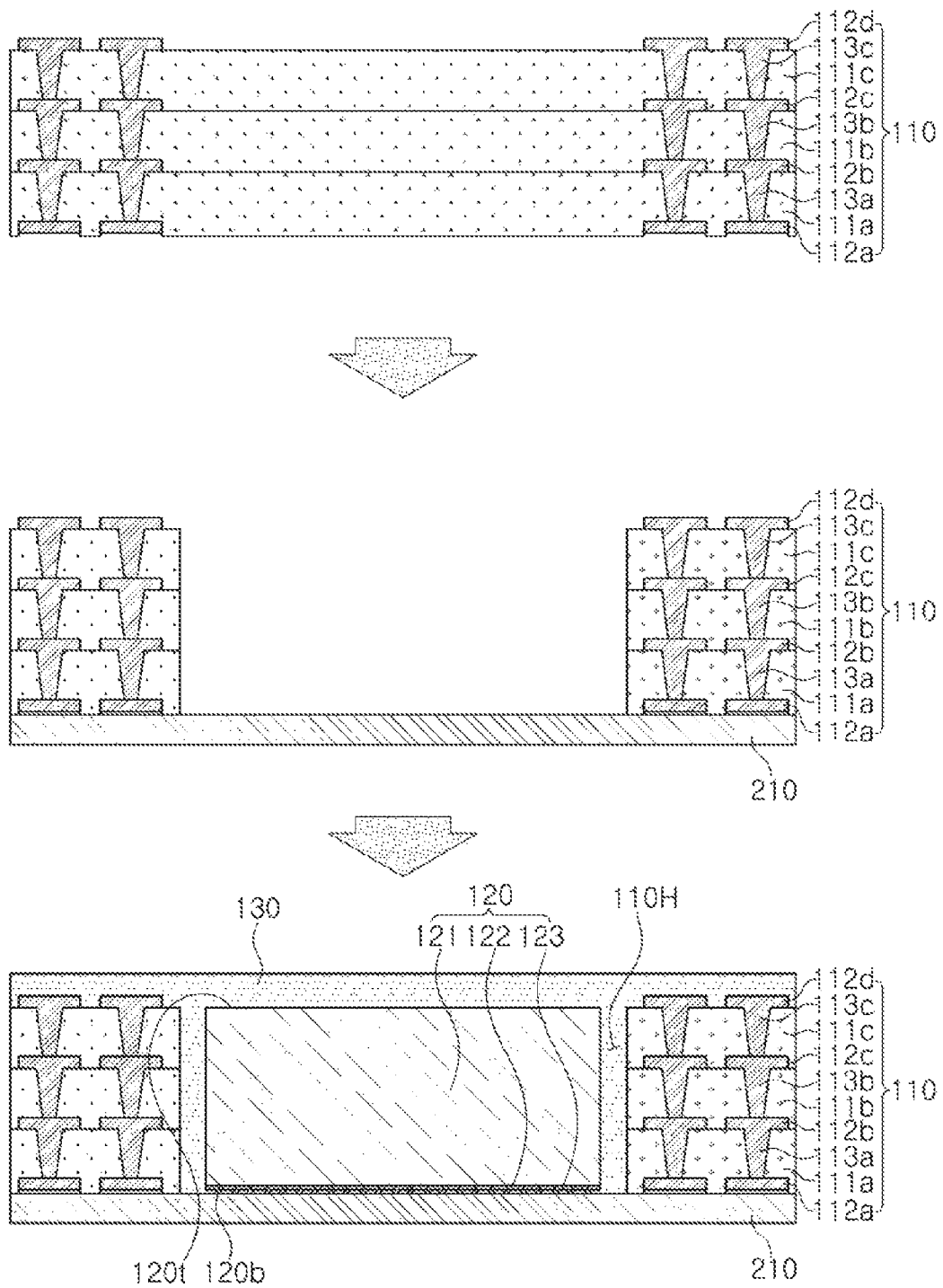
FIGS. 11A through 11C are schematic views illustrating an example of processes of manufacturing the fan-out semiconductor package of FIG. 9.
Figure 11B:
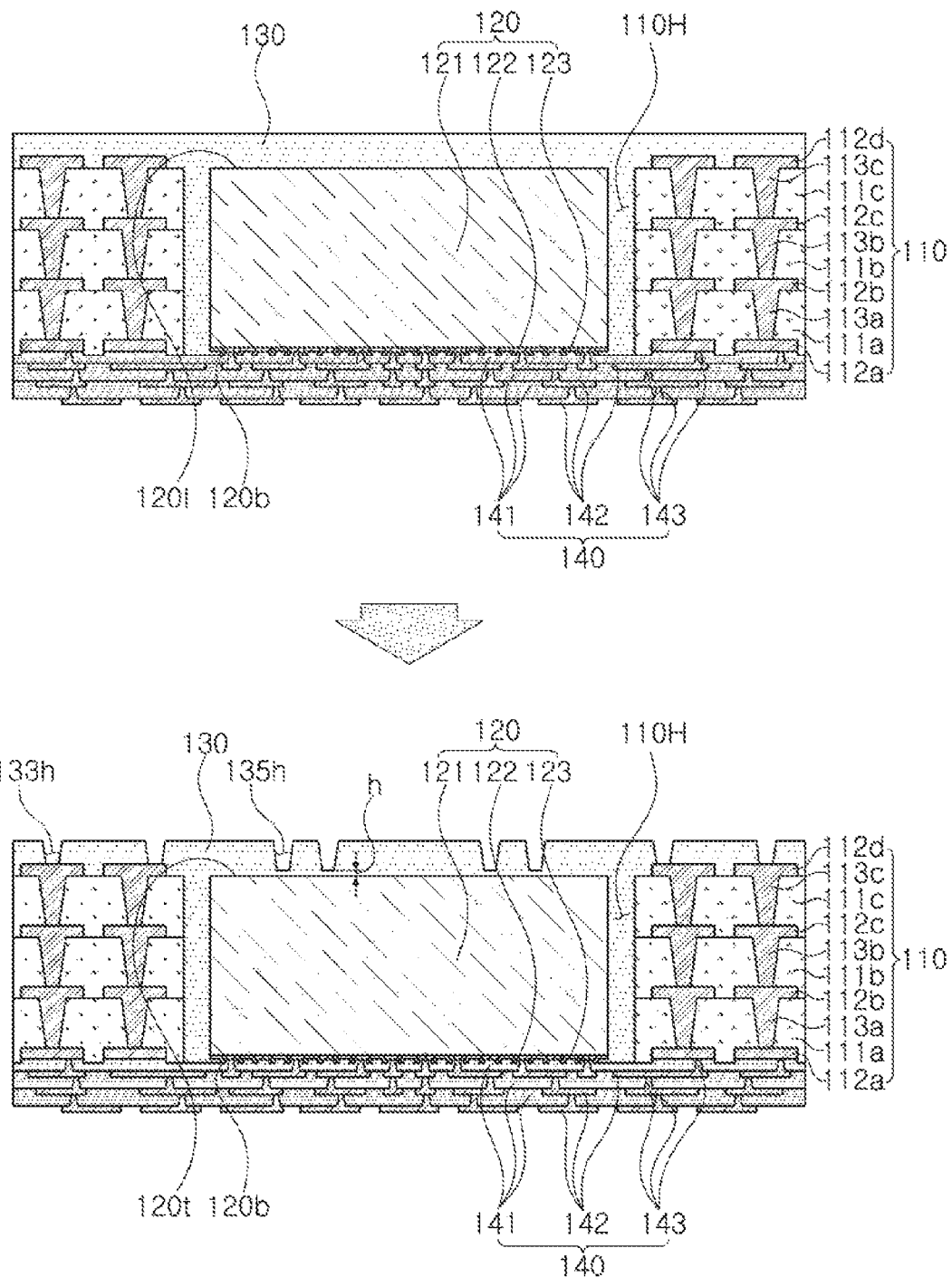
Figure 11C:
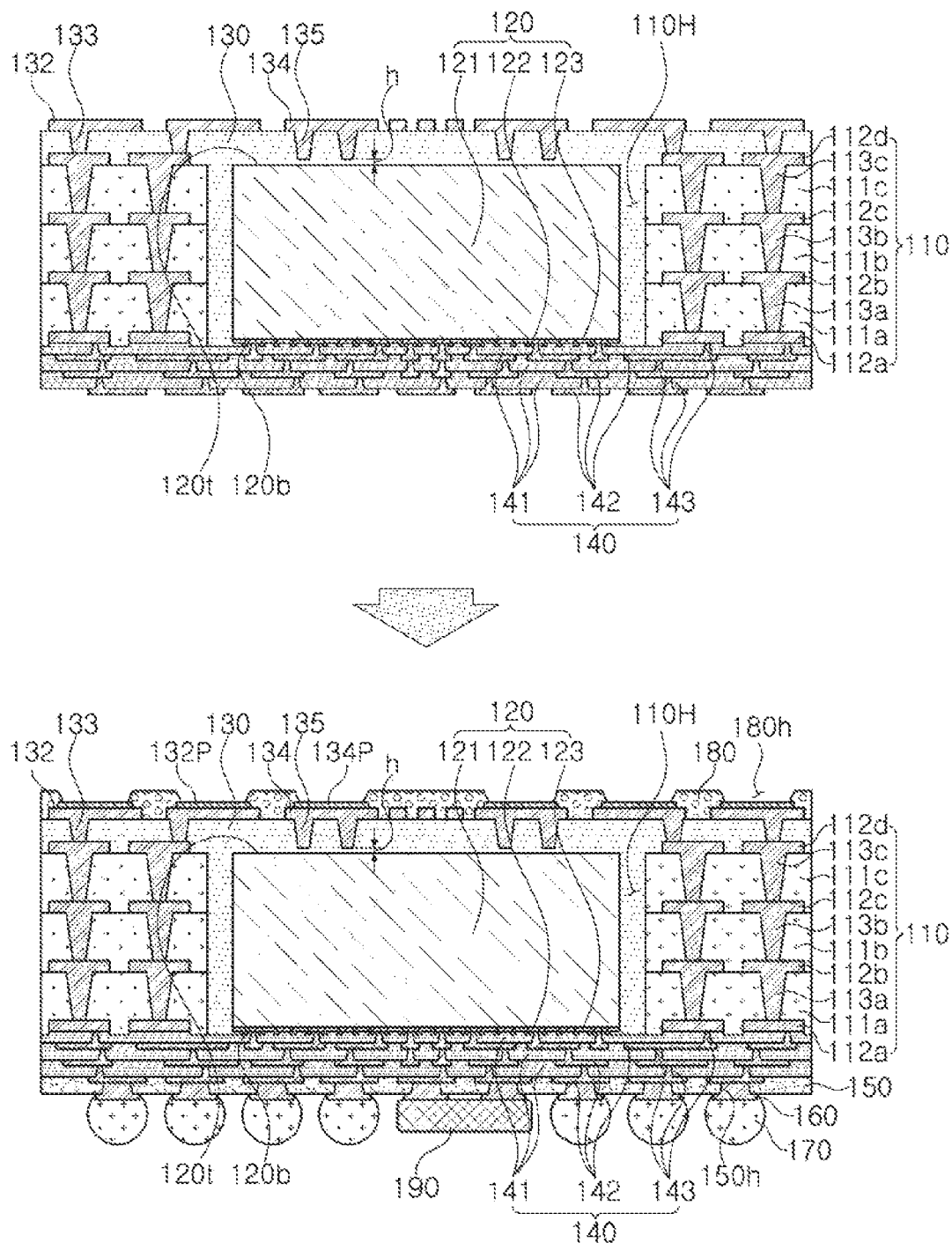

FIGS. 11A through 11C are schematic views illustrating an example of processes of manufacturing the fan-out semiconductor package of FIG. 9.

Referring to FIG. 11A, the frame 110 may be first prepared. The frame 110 may be manufactured using a coreless substrate. In detail, the frame 110 may be prepared by repeating a series of processes forming the first wiring layer 112a on the coreless substrate by a plating process, forming the first insulating layer 111a by laminating ABF, or the like, forming laser via holes in the first insulating layer 111a using some pad patterns of the first wiring layer 112a as stoppers, forming the second wiring layer 112b and the first wiring vias 113a by a plating process, and then separating and removing the coreless substrate. A metal layer remaining on a lower surface of the frame 110 after the coreless substrate is separated may be removed by etching. In this case, the step may be formed between the lower surface of the first insulating layer 111a and the lower surface of the first wiring layer 112a of the frame 110. Then, the through-hole 110H may be formed in the frame 110 using a laser drill, a mechanical drill, or the like, and a tape 210 may be attached to a lower portion of the frame 110. Then, the semiconductor chip 120 may be attached to the tape 210 in the through-hole 110H, and the encapsulant 130 may be formed by ABF lamination, or the like.

Then, referring to FIG. 11B, the tape 210 may be removed, and the connection structure 140 may be formed in a region in which the tape 210 is removed. The connection structure 140 may be formed by repeating a series of processes of forming the insulating layer 141 by PID coating, forming photo via holes in the insulating layer 141 by a photolithography method, and forming the redistribution layer 142 and the connection vias 143 by a plating process. Then, first and second via holes 135h and 133h may be formed in the encapsulant 130 by laser drilling, or the like. In this case, the first via holes 135h may be formed to be physically spaced apart from the inactive surface 120t of the semiconductor chip 120 by a predetermined distance h. The second via holes 133h may be formed to open at least portions of the fourth wiring layer 112d.

Referring to FIG. 11C, the first and second via holes 135h and 133h may be filled by any known plating process to form the thermally conductive vias 135 and the wiring vias 133, and the thermally conductive pattern layer 134 and the wiring pattern layer 132 may be formed on the encapsulant 130. The thermally conductive via 135 and the thermally conductive pattern layer 134, and the wiring via 133 and the wiring pattern layer 132 may be simultaneously formed by plating, such that the thermally conductive via 135 and the thermally conductive pattern layer 134, and the wiring via 133 and the wiring pattern layer 132 may be integrated with each other without having boundaries therebetween, respectively. Then, the passivation layer 150 and the cover layer 180 may be formed at opposite sides of the fan-out semiconductor package, respectively, by ABF lamination, or the like, the openings 150h and 180h may be formed in the passivation layer 150 and the cover layer 180, respectively, using a laser drill, or the like, and the underbump metals 160 may then be formed by plating. In addition, the electrical connection structures 170 may be formed of the low melting point metal, or the like, and a reflow process may be performed. The fan-out semiconductor package 100A according to the exemplary embodiment described above may be formed by a series of processes.

The series of processes described above may be performed using a frame 110 having a large size, that is, a panel size. In this case, a plurality of fan-out semiconductor packages 100A may be formed through the frame 110 having the panel size, and when the plurality of fan-out semiconductor packages 100A are separated from one another by a dicing process, the plurality of fan-out semiconductor packages 100A may be obtained by performing one process.

Figure 12:
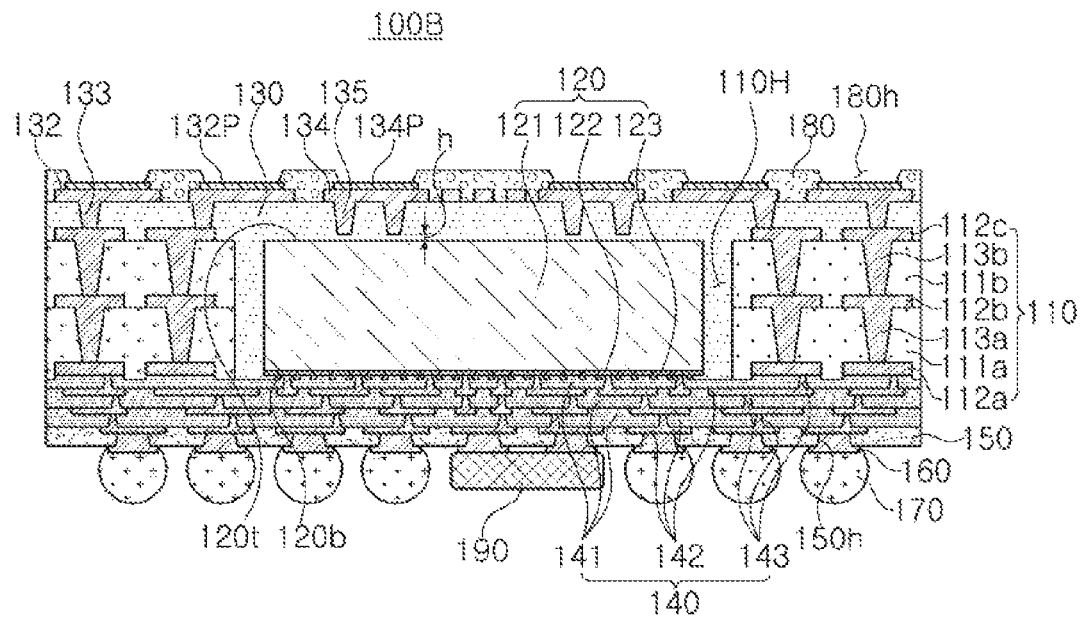
FIG. 12 is a schematic cross-sectional view illustrating a fan-out semiconductor package according to another exemplary embodiment in the present disclosure.

FIG. 12 is a schematic cross-sectional view illustrating a fan-out semiconductor package according to another exemplary embodiment in the present disclosure.

Referring to FIG. 12, a fan-out semiconductor package 100B according to another exemplary embodiment in the present disclosure may be different from the fan-out semiconductor package 100A according to the exemplary embodiment described above in that the third insulating layer 111c, the third wiring vias 113c, and the fourth wiring layer 112d are omitted in a frame 110. That is, the numbers of insulating layers, wiring layers, and layers of wiring vias of the frame 110 may be various. In this case, a thickness of the frame 110 may be changed, and a thickness of the semiconductor chip 120 may thus be changed depending on the changed thickness of the frame 110. A description of other configurations overlaps those described above with reference to FIGS. 9 through 11, and is thus omitted.

Figure 13:
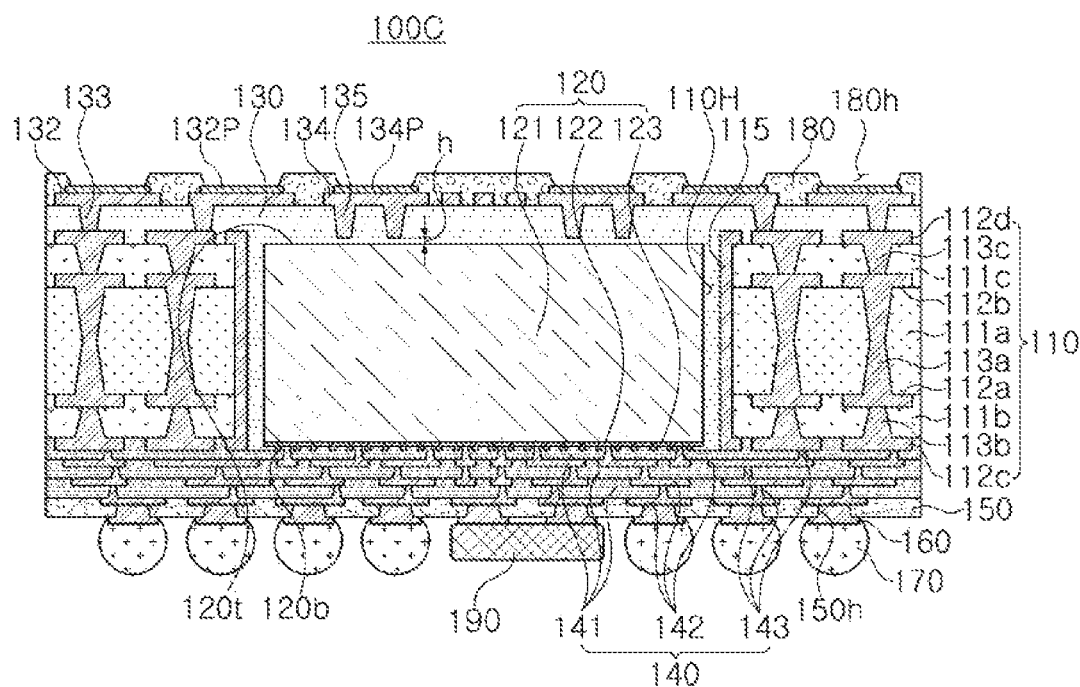
FIG. 13 is a schematic cross-sectional view illustrating a fan-out semiconductor package according to another exemplary embodiment in the present disclosure.

FIG. 13 is a schematic cross-sectional view illustrating a fan-out semiconductor package according to another exemplary embodiment in the present disclosure.

Referring to FIG. 13, a fan-out semiconductor package 100C according to another exemplary embodiment in the present disclosure may be different from the fan-out semiconductor package 100A according to the exemplary embodiment described above in that a frame 110 includes a first insulating layer 111a, a first wiring layer 112a and a second wiring layer 112b disposed on a lower surface and an upper surface of the first insulating layer 111a, respectively, a second insulating layer 111b disposed on the lower surface of the first insulating layer 111a and covering the first wiring layer 112a, a third wiring layer 112c disposed on a lower surface of the second insulating layer 111b, a third insulating layer 111c disposed on the upper surface of the first insulating layer 111a and covering the second wiring layer 112b, and a fourth wiring layer 112d disposed on an upper surface of the third insulating layer 111c. The first to fourth wiring layers 112a, 112b, 112c, and 112d may be electrically connected to each other through first to third wiring vias 113a, 113b, and 113c respectively penetrating through the first to third insulating layers 111a, 111b, and 111c. The first to fourth wiring layers 112a, 112b, 112c, and 112d may be electrically connected to connection pads 122. Since the frame 110 may include a large number of wiring layers 112a, 112b, 112c, and 112d, a connection structure 140 may be simplified. Therefore, a decrease in a yield depending on a defect occurring in a process of forming the connection structure 140 may be suppressed.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto, and all of the first insulating layer 111a and the second and third insulating layers 111b and 111c may include prepreg, or the like. The first wiring via 113a penetrating through the first insulating layer 111a may have a diameter and volume greater than those of the second and third wiring vias 113b and 113c respectively penetrating through the second and third insulating layers 111b and 111c.

A lower surface of the third wiring layer 112c of the frame 110 may be disposed on a level below a lower surface of the connection pad 122 of a semiconductor chip 120. In addition, a distance between the uppermost redistribution layer 142 of the connection structure 140 and the third wiring layer 112c of the connection structure 140 may be smaller than that between the uppermost redistribution layer 142 of the connection structure 140 and the connection pad 122 of the semiconductor chip 120. The reason is that the third wiring layer 112c may be disposed on the second insulating layer 111b in a protruding form, resulting in being in contact with the connection structure 140. The first wiring layer 112a and the second wiring layer 112b of the frame 110 may be disposed on a level between an active surface 120b and an inactive surface 120t of the semiconductor chip 120. A thickness of each of the wiring layers 112a, 112b, 112c, and 112d of the frame 110 may be greater than that of each of the redistribution layers 142 of the connection structure 140. The first wiring via 113a may have a hourglass shape, and the second and third wiring vias 113b and 113c may have tapered shapes of which directions are opposite to each other. A metal layer 115 may be disposed on walls of a through-hole 110H in order to dissipate heat and/or block electromagnetic waves. The metal layer 115 may surround side surfaces of the semiconductor chip 120 in a plate shape. The metal layer 115 may include a metal having excellent thermal conductivity, such as copper (Cu), or the like. The metal layer 115 may be electrically connected to ground patterns of the wiring layers 112a, 112b, 112c, and 112d and the redistribution layers 142. A description of other configurations overlaps those described above with reference to FIGS. 9 through 12, and is thus omitted.

Figure 14:
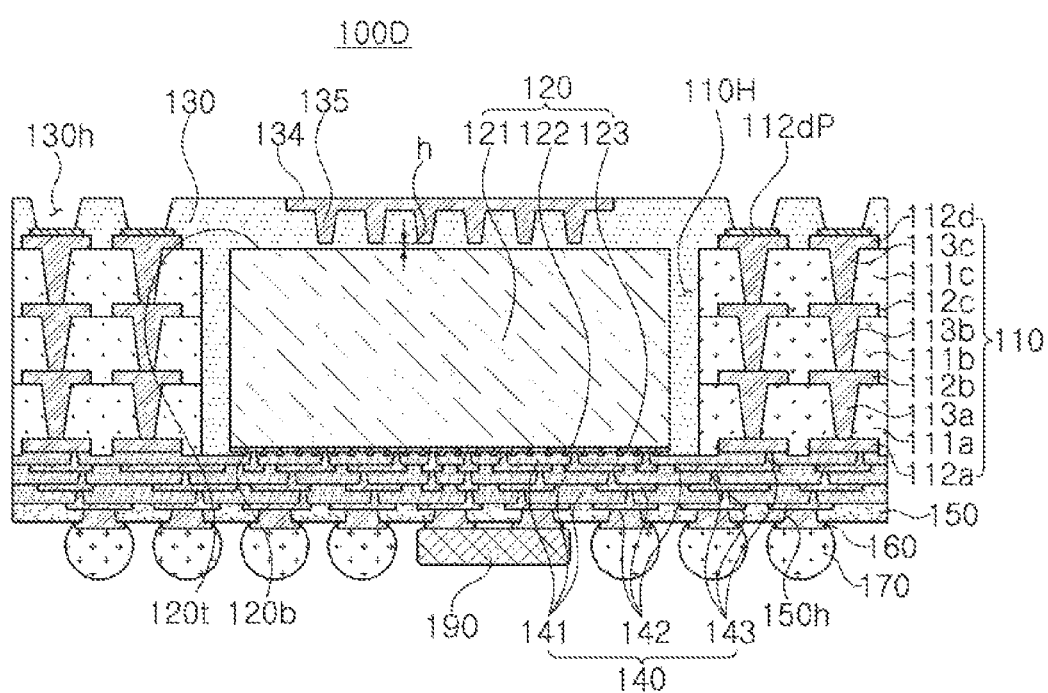
FIG. 14 is a schematic cross-sectional view illustrating a fan-out semiconductor package according to another exemplary embodiment in the present disclosure.

FIG. 14 is a schematic cross-sectional view illustrating a fan-out semiconductor package according to another exemplary embodiment in the present disclosure.

Referring to FIG. 14, a fan-out semiconductor package 100D according to another exemplary embodiment in the present disclosure may include a semiconductor chip 120 having an active surface 120b having connection pads 122 disposed thereon and an inactive surface 120t opposing the active surface 120b, an encapsulant 130 covering the inactive surface 120t of the semiconductor chip 120, thermally conductive vias 135 penetrating through at least portions of the encapsulant 130 on the inactive surface 120t of the semiconductor chip 120 and physically spaced apart from the inactive surface 120t of the semiconductor chip 120 by a predetermined distance h, a thermally conductive pattern layer 134 embedded in the encapsulant 130 so that an upper surface thereof is exposed and connected to the thermally conductive vias 135, and a connection structure 140 disposed on the active surface 120b of the semiconductor chip 120 and including redistribution layers 142 electrically connected to the connection pads 122 of the semiconductor chip 120. An upper surface of the thermally conductive pattern layer 134 and an upper surface of the encapsulant 130 may be coplanar, or substantially coplanar, with each other. The fan-out semiconductor package 100D may further include a frame 110, a passivation layer 150, a surface mounting component 190, underbump metals 160, electrical connection structures 170, and the like, if necessary.

In the fan-out semiconductor package 100D according to another exemplary embodiment, the thermally conductive pattern layer 134 may be embedded in the encapsulant 130, such that a distance between the inactive surface 120t of the semiconductor chip 120 and the thermally conductive pattern layer 134 is short, resulting in an excellent heat dissipation effect. Particularly, in a case in which a heat dissipation member is simply formed at an upper portion of the manufactured fan-out semiconductor package, when a defect occurs in a process of forming the heat dissipation member, the fan-out semiconductor package itself needs to be discarded, and a yield problem of the semiconductor chip may thus occur. On the other hand, in the fan-out semiconductor package 100D according to another exemplary embodiment, the thermally conductive pattern layer 134 and the thermally conductive vias 135 may be separately formed through a separate carrier as described below, and a carrier on which only good thermally conductive pattern layer 134 and thermally conductive vias 135 are formed may be bonded to an upper portion of the fan-out semiconductor package 100D to embed the thermally conductive pattern layer 134 and thermally conductive vias 135 in the fan-out semiconductor package 100D. Therefore, a yield decrease problem of the semiconductor chip that may occur in the process of forming the heat dissipation member may be prevented.

Openings 130h opening at least portions of a fourth wiring layer 112d, which is the uppermost wiring layer of the frame 110, may be formed in the encapsulant 130, and a surface treatment layer 112dP may be formed on a surface of the fourth wiring layer 112d exposed by the openings 130h. An upper surface of the uppermost insulating layer of the frame 100 (e.g., the third insulating layer 111c) may be disposed on a level the same as or above a level of the active surface 120t of the semiconductor chip 120 with respect to the connection structure 140, and a thickness of the uppermost wiring layer of the frame (e.g., the fourth wiring layer 112d) may be greater than the distance h. As such, a depth of the openings 130h may be less than a sum of thicknesses of the thermally conductive via 135 and the thermally conductive pattern layer 134. A description of other configurations overlaps those described above with reference to FIGS. 9 through 13, and is thus omitted.

Figure 15A:
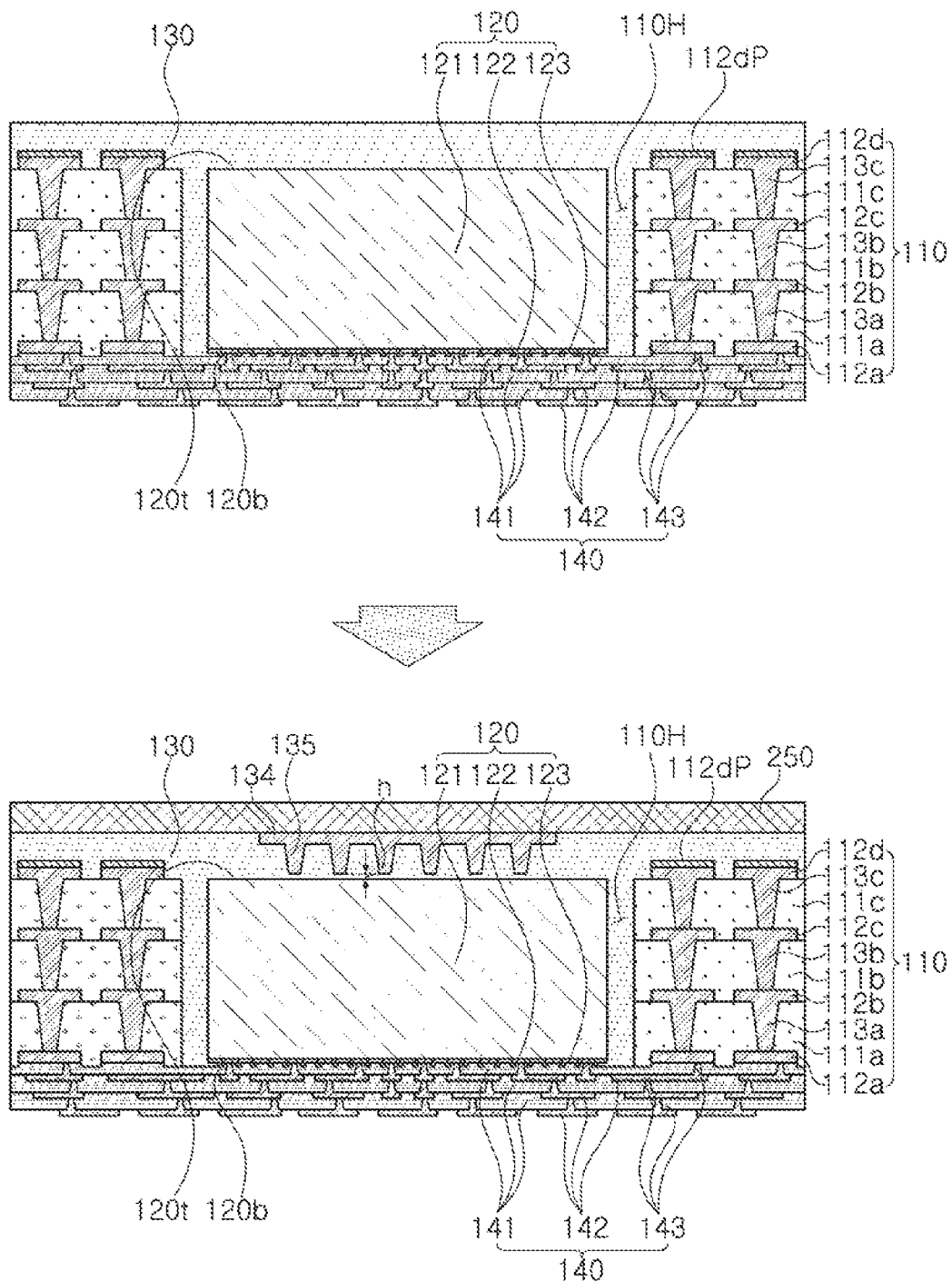
FIGS. 15A and 15B are schematic views illustrating an example of processes of manufacturing the fan-out semiconductor package of FIG. 14.
Figure 15B:
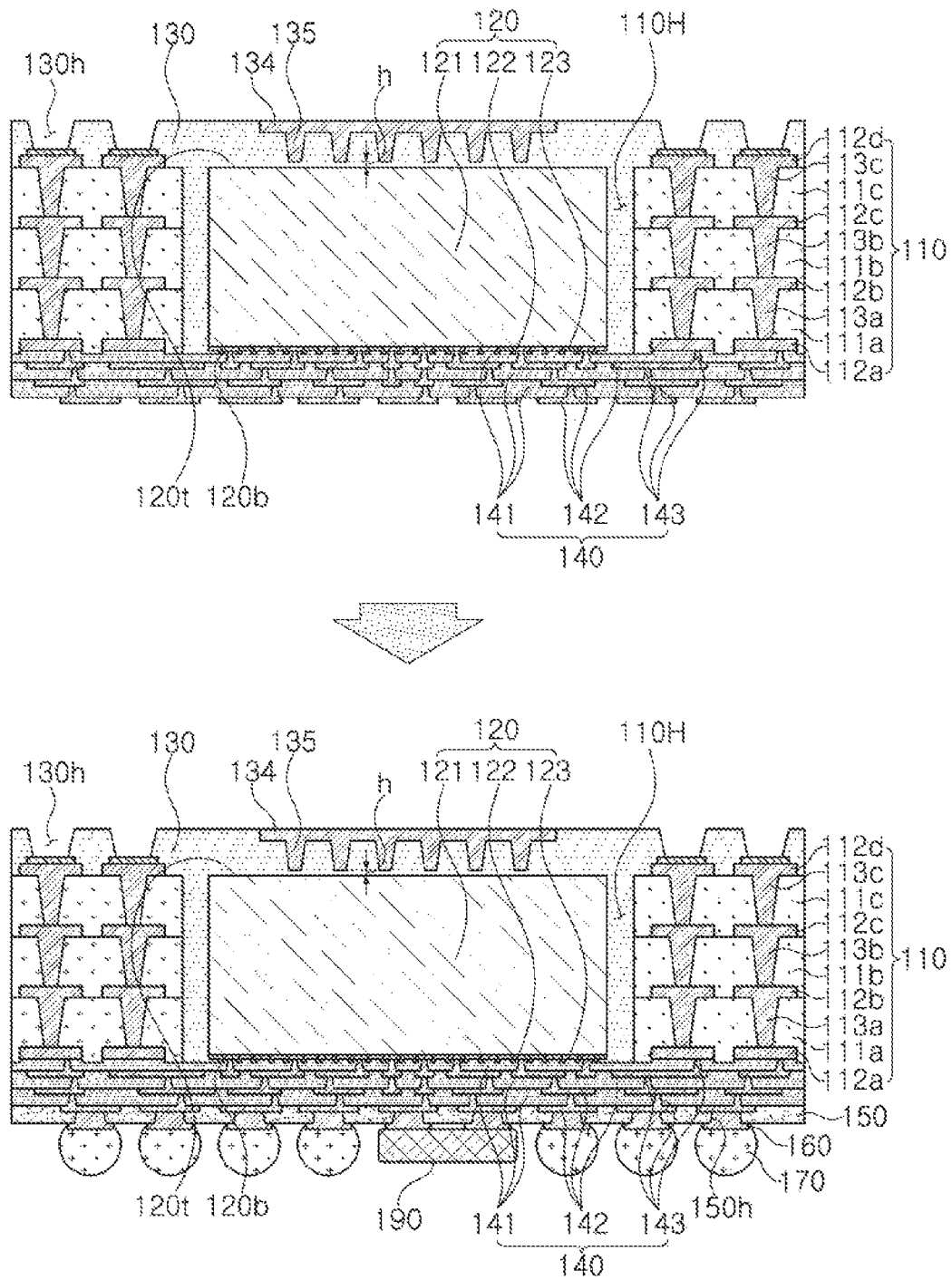

FIGS. 15A and 15B are schematic views illustrating an example of processes of manufacturing the fan-out semiconductor package of FIG. 14.

Referring to FIG. 15A, a tape may be first removed from an intermediate formed through the process of FIG. 11A described above, or the like, and the connection structure 140 may be formed in a region in which the tape is removed. Then, the thermally conductive vias 135 and the thermally conductive pattern layer 134 may be formed on a carrier 250 by a plating process, or the like, and the carrier 250 on which the thermally conductive vias 135 and the thermally conductive pattern layer 134 are formed may be bonded to the encapsulant 130. The thermally conductive vias 135 and the thermally conductive pattern layer 134 may be embedded in the encapsulant 130 in a bonding process.

Then, referring to FIG. 15B, the carrier 250 may be removed by a separation method, or the like. An upper surface of the thermally conductive pattern layer 134 and an upper surface of the encapsulant 130 may be coplanar, or substantially coplanar, with each other. The openings 130h opening at least portions of the fourth wiring layer 112d, which is the uppermost wiring layer of the frame 110, may be formed by laser drilling, or the like. Then, the passivation layer 150 may be formed at a lower side of the fan-out semiconductor package by ABF lamination, or the like, openings 150h may be formed in the passivation layer 150 by laser drilling, or the like, and the underbump metals 160 may then be formed by plating. In addition, the electrical connection structures 170 may be formed of the low melting point metal, or the like, and a reflow process may be performed. The fan-out semiconductor package 100D according to another exemplary embodiment described above may be formed by a series of processes. A description of other configurations overlaps those described above with reference to FIGS. 9 through 14, and is thus omitted.

Figure 16:
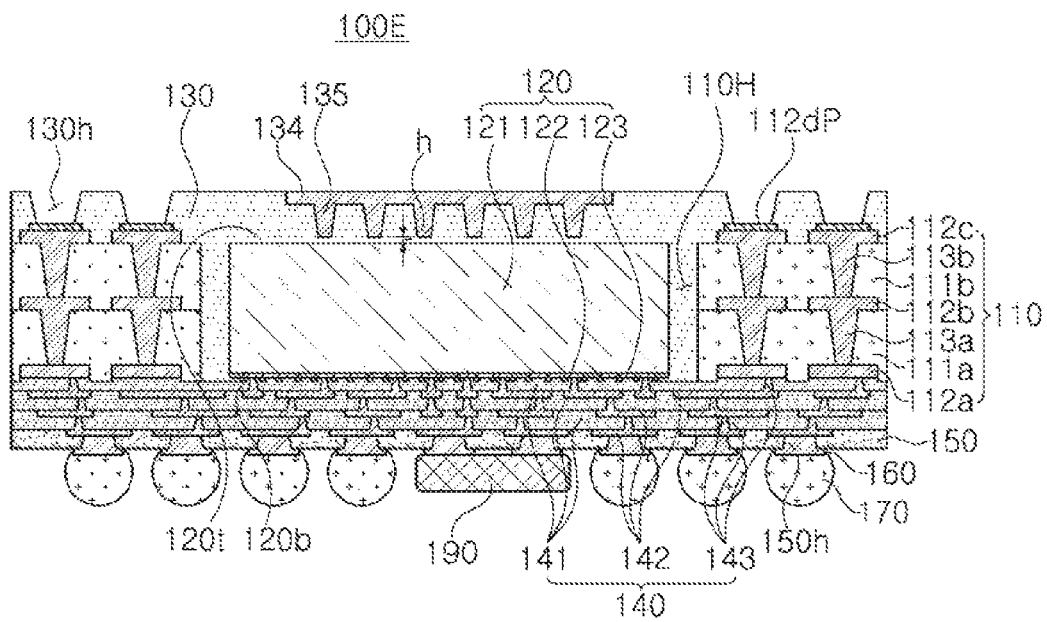
FIG. 16 is a schematic cross-sectional view illustrating a fan-out semiconductor package according to another exemplary embodiment in the present disclosure.

FIG. 16 is a schematic cross-sectional view illustrating a fan-out semiconductor package according to another exemplary embodiment in the present disclosure.

Referring to FIG. 16, a fan-out semiconductor package 100E according to another exemplary embodiment in the present disclosure may be different from the fan-out semiconductor package 100D according to another exemplary embodiment described above in that the third insulating layer 111c, the third wiring vias 113c, and the fourth wiring layer 112d are omitted in a frame 110. That is, the numbers of insulating layers, wiring layers, and layers of wiring vias of the frame 110 may be various. In this case, a thickness of the frame 110 may be changed, and a thickness of the semiconductor chip 120 may thus be changed depending on the changed thickness of the frame 110. A description of other configurations overlaps those described above with reference to FIGS. 9 through 15B, and is thus omitted.

Figure 17:
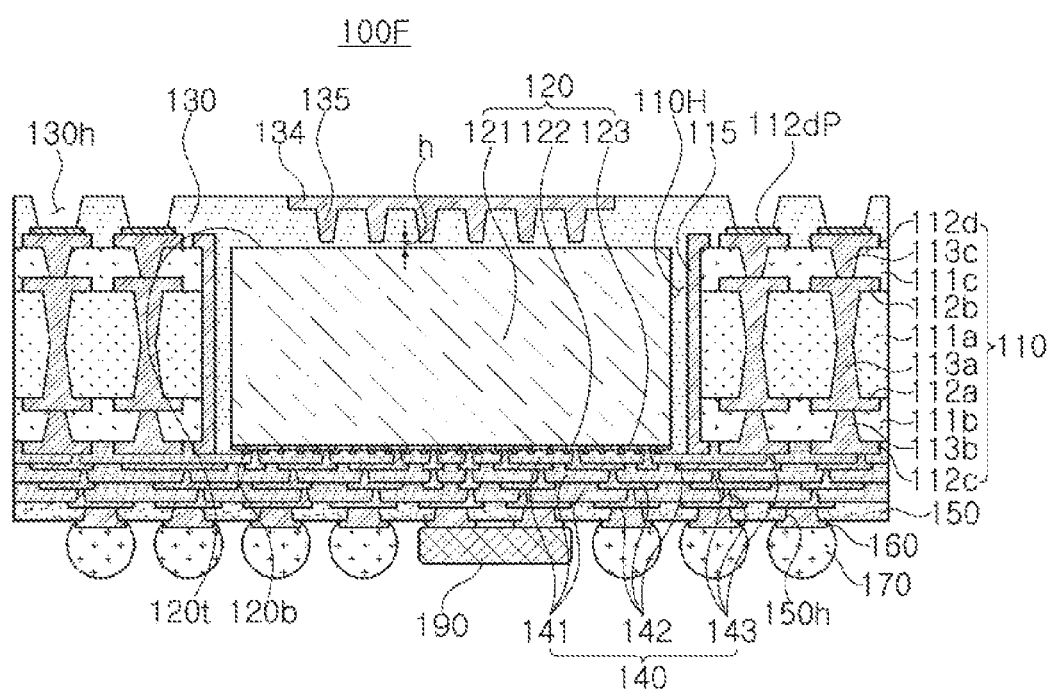
FIG. 17 is a schematic cross-sectional view illustrating a fan-out semiconductor package according to another exemplary embodiment in the present disclosure.

FIG. 17 is a schematic cross-sectional view illustrating a fan-out semiconductor package according to another exemplary embodiment in the present disclosure.

Referring to FIG. 17, a fan-out semiconductor package 100F according to another exemplary embodiment in the present disclosure may be different from the fan-out semiconductor package 100D according to another exemplary embodiment described above in that a frame 110 includes a first insulating layer 111a, a first wiring layer 112a and a second wiring layer 112b disposed on a lower surface and an upper surface of the first insulating layer 111a, respectively, a second insulating layer 111b disposed on the lower surface of the first insulating layer 111a and covering the first wiring layer 112a, a third wiring layer 112c disposed on a lower surface of the second insulating layer 111b, a third insulating layer 111c disposed on the upper surface of the first insulating layer 111a and covering the second wiring layer 112b, and a fourth wiring layer 112d disposed on an upper surface of the third insulating layer 111c. The first to fourth wiring layers 112a, 112b, 112c, and 112d may be electrically connected to each other through first to third wiring vias 113a, 113b, and 113c respectively penetrating through the first to third insulating layers 111a, 111b, and 111c. The fan-out semiconductor package 100F may further include a metal layer 115 disposed on walls of the frame 110. A description of other configurations overlaps those described above with reference to FIGS. 9 through 16, and is thus omitted.

Figure 18:
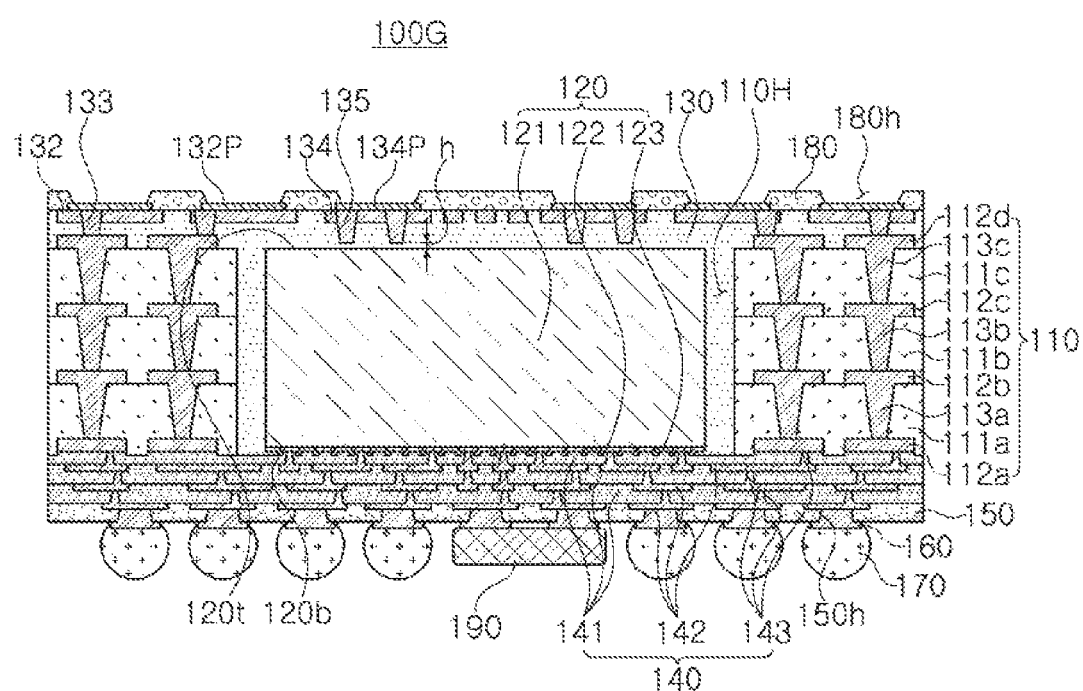
FIG. 18 is a schematic cross-sectional view illustrating a fan-out semiconductor package according to another exemplary embodiment in the present disclosure.

FIG. 18 is a schematic cross-sectional view illustrating a fan-out semiconductor package according to another exemplary embodiment in the present disclosure.

Referring to FIG. 18, a fan-out semiconductor package 100G according to another exemplary embodiment in the present disclosure may include a semiconductor chip 120 having an active surface 120b having connection pads 122 disposed thereon and an inactive surface 120t opposing the active surface 120b, an encapsulant 130 covering the inactive surface 120t of the semiconductor chip 120, thermally conductive vias 135 penetrating through at least portions of the encapsulant 130 on the inactive surface 120t of the semiconductor chip 120 and physically spaced apart from the inactive surface 120t of the semiconductor chip 120 by a predetermined distance h, a thermally conductive pattern layer 134 embedded in the encapsulant 130 so that an upper surface thereof is exposed and connected to the thermally conductive vias 135, and a connection structure 140 disposed on the active surface 120b of the semiconductor chip 120 and including redistribution layers 142 electrically connected to the connection pads 122 of the semiconductor chip 120. The fan-out semiconductor package 100G may further include a frame 110, a wiring pattern layer 132, wiring vias 133, a passivation layer 150, a surface mounting component 190, underbump metals 160, electrical connection structures 170, a cover layer 180, and the like.

Also in the fan-out semiconductor package 100G according to another exemplary embodiment, the thermally conductive pattern layer 134 may be embedded in the encapsulant 130, such that a distance between the inactive surface 120t of the semiconductor chip 120 and the thermally conductive pattern layer 134 is short, resulting in an excellent heat dissipation effect. In addition, the thermally conductive pattern layer 134 may be separately formed through a separate carrier as described below, and a carrier on which only good thermally conductive pattern layer 134 is formed may be bonded to an upper portion of the fan-out semiconductor package 100G to embed the thermally conductive pattern layer 134 in the fan-out semiconductor package 100G. Therefore, a yield decrease problem of the semiconductor chip that may occur in the process of forming the heat dissipation member may be prevented. In addition, the wiring pattern layer 132 may also be introduced by bonding through a carrier, similar to the thermally conductive pattern layer 134, and may be embedded in the encapsulant 130 in a form that is substantially the same as that of the thermally conductive pattern layer 134, and a yield problem may thus be solved in a process of introducing a backside wiring.

In the fan-out semiconductor package 100G according to another exemplary embodiment, the thermally conductive vias 135 may be formed to penetrate through the thermally conductive pattern layer 134. Similarly, the wiring vias 133 may be formed to penetrate through the wiring pattern layer 132. That is, a boundary between the thermally conductive via 135 and the thermally conductive pattern layer 134 may be distinguished. In addition, a boundary between the wiring via 133 and the wiring pattern layer 132 may also be distinguished. Each of the thermally conductive pattern layer 134 and the wiring pattern layer 132 may have a doughnut shape when being cut by a plane parallel with the inactive surface 120t of the semiconductor chip 120. This may be implemented by introducing the thermally conductive pattern layer 134 and the wiring pattern layer 132 in a state in which the thermally conductive pattern layer 134 and the wiring pattern layer 132 are embedded through a carrier as in a process to be described below, forming via holes penetrating through the thermally conductive patterns layer 134 and the wiring pattern layer 132, and then forming the thermally conductive vias 135 and the wiring vias 133 by plating. In this case, only the thermally conductive pattern layer 132 and/or the wiring pattern layer 134 may be formed on the carrier. Therefore, a good intermediate may be more easily formed, and the thermally conductive vias 135 and/or the wiring vias 133 may be easily formed at positions required depending on a design. A description of other configurations overlaps those described above with reference to FIGS. 9 through 17, and is thus omitted.

Figure 19A:
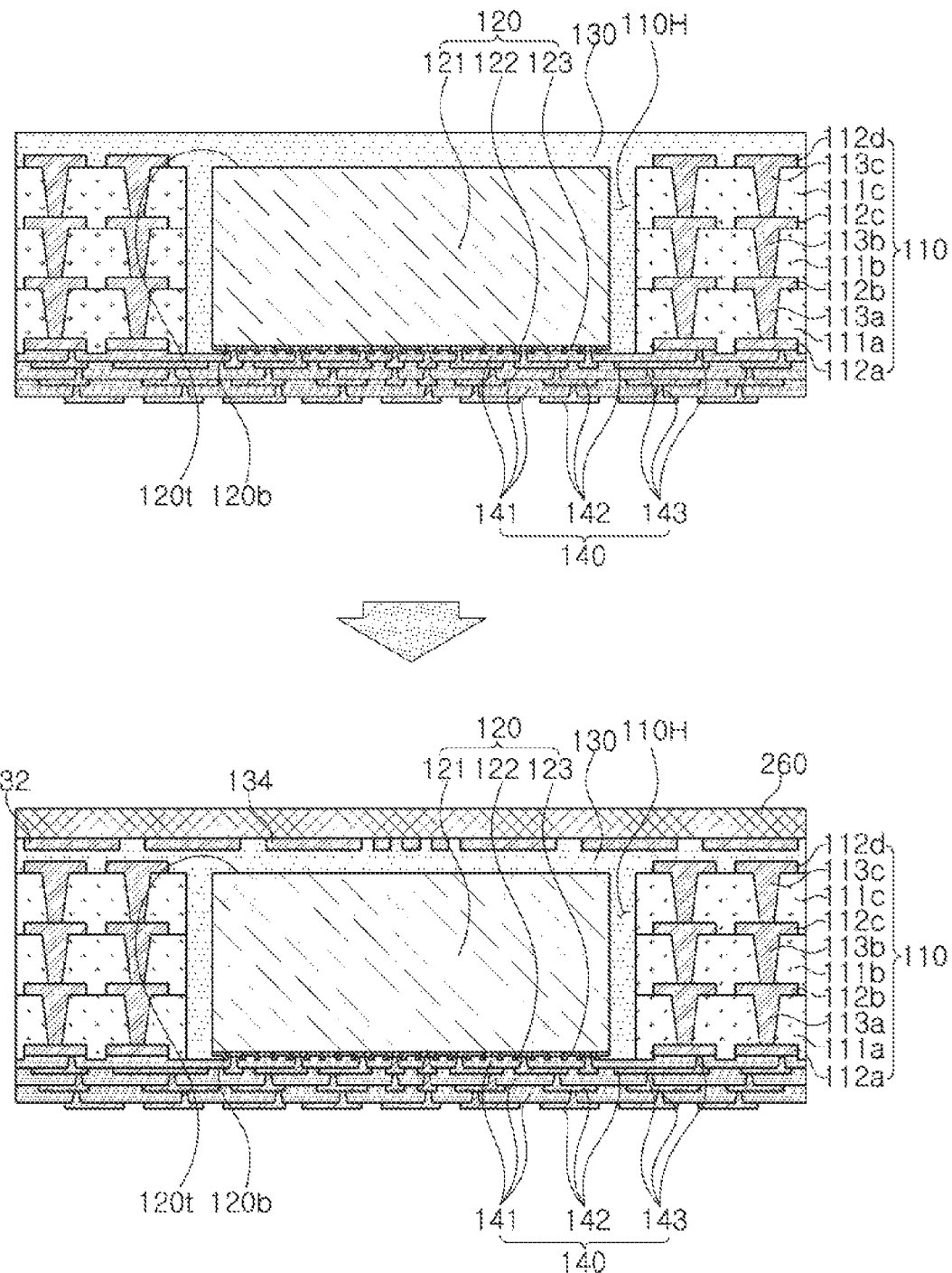
FIGS. 19A and 19B are schematic views illustrating an example of processes of manufacturing the fan-out semiconductor package of FIG. 18.
Figure 19B:
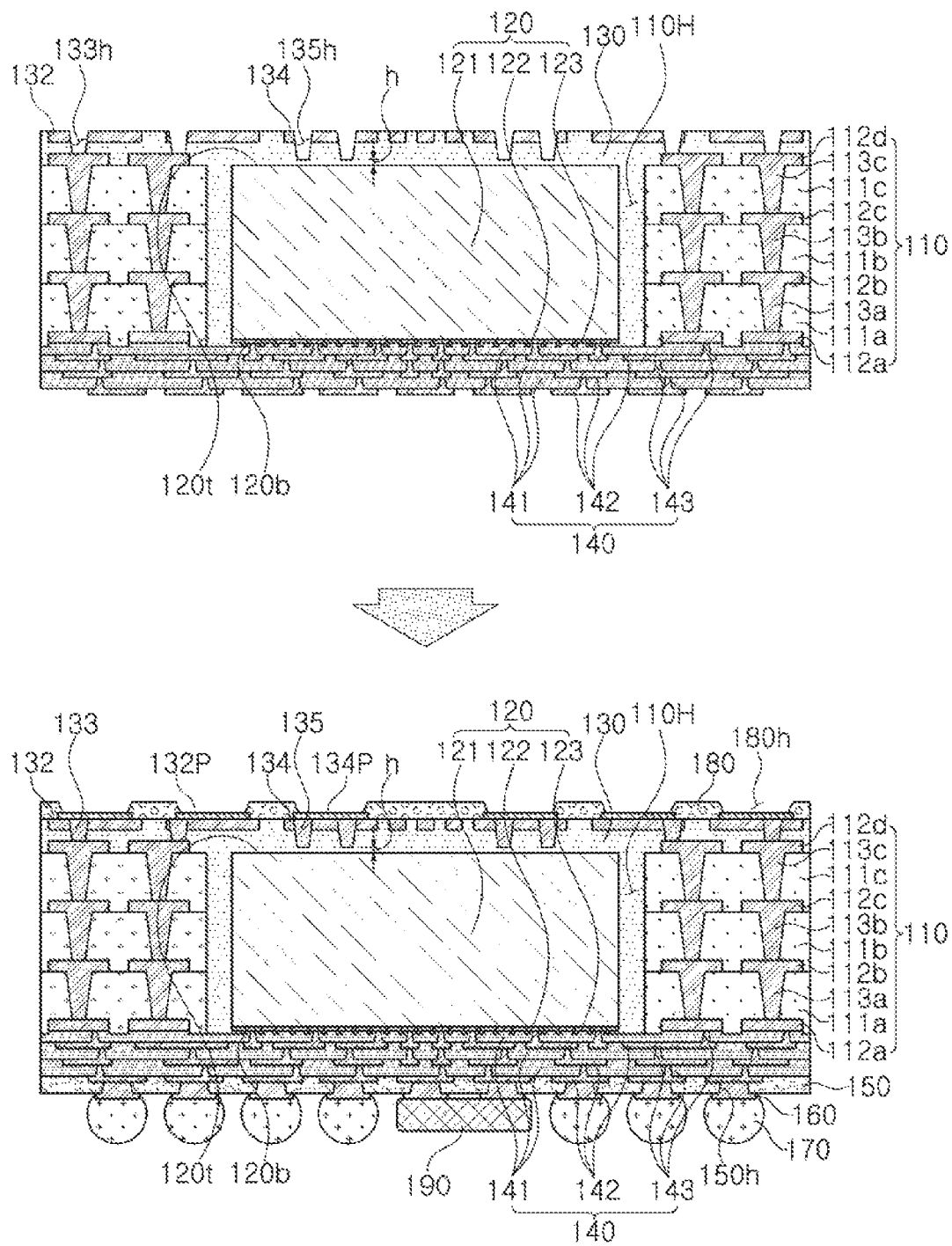

FIGS. 19A and 19B are schematic views illustrating an example of processes of manufacturing the fan-out semiconductor package of FIG. 18.

Referring to FIG. 19A, a tape may be first removed from an intermediate formed through the process of FIG. 11A described above, or the like, and the connection structure 140 may be formed in a region in which the tape is removed. Then, the thermally conductive pattern layer 134 and the wiring pattern layer 132 may be formed on a carrier 260 by a plating process, or the like, and the carrier 260 on which the thermally conductive pattern layer 133 and the wiring pattern layer 132 are formed may be bonded to the encapsulant 130. The thermally conductive pattern layer 134 and the wiring pattern layer 132 may be embedded in the encapsulant 130 in a bonding process.

Then, referring to FIG. 19B, the carrier 260 may be removed by a separation method, or the like, and first and second via holes 135h and 133h may be formed by laser drilling, or the like. In this case, the first via holes 135h may be formed to be physically spaced apart from the inactive surface 120t of the semiconductor chip 120 by a predetermined distance h. The second via holes 133h may be formed to open at least portions of the fourth wiring layer 112d. Then, the first and second via holes 135h and 133h may be filled by any known plating process to form the thermally conductive vias 135 and the wiring vias 133. Then, the passivation layer 150 and the cover layer 180 may be formed at opposite sides of the fan-out semiconductor package, respectively, by ABF lamination, or the like, the openings 150h and 180h may be formed in the passivation layer 150 and the cover layer 180, respectively, using a laser drill, or the like, and the underbump metals 160 may then be formed by plating. In addition, the electrical connection structures 170 may be formed of the low melting point metal, or the like, and a reflow process may be performed. The fan-out semiconductor package 100G according to another exemplary embodiment described above may be formed by a series of processes. A description of other configurations overlaps those described above with reference to FIGS. 9 through 18, and is thus omitted.

Figure 20:
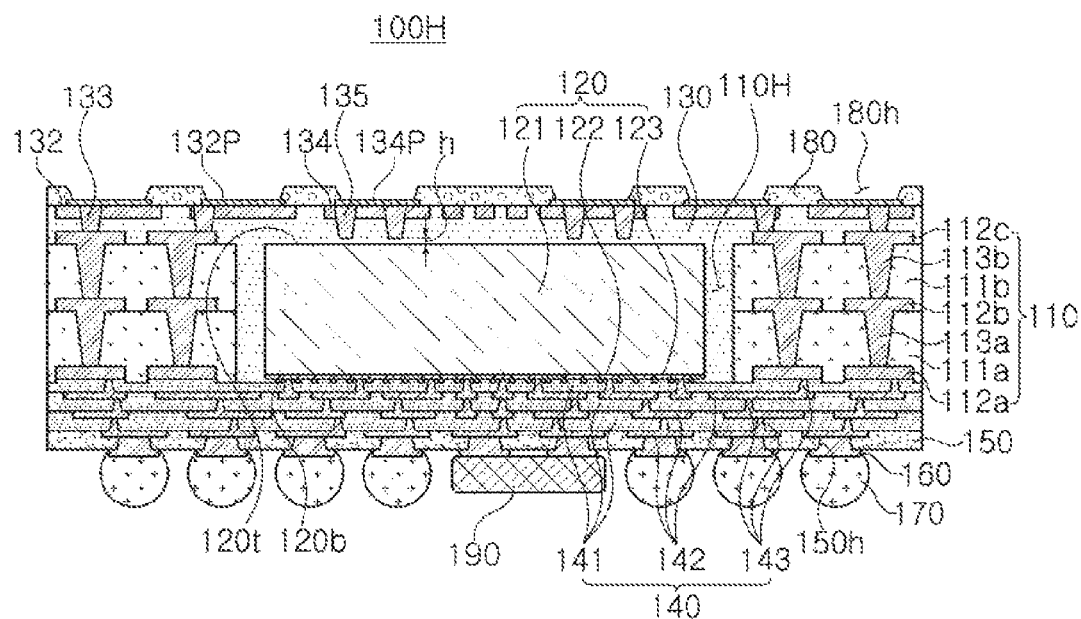
FIG. 20 is a schematic cross-sectional view illustrating a fan-out semiconductor package according to another exemplary embodiment in the present disclosure.

FIG. 20 is a schematic cross-sectional view illustrating a fan-out semiconductor package according to another exemplary embodiment in the present disclosure.

Referring to FIG. 20, a fan-out semiconductor package 100H according to another exemplary embodiment in the present disclosure may be different from the fan-out semiconductor package 100G according to another exemplary embodiment described above in that the third insulating layer 111c, the third wiring vias 113c, and the fourth wiring layer 112d are omitted in a frame 110. That is, the numbers of insulating layers, wiring layers, and layers of wiring vias of the frame 110 may be various. In this case, a thickness of the frame 110 may be changed, and a thickness of the semiconductor chip 120 may thus be changed depending on the changed thickness of the frame 110. A description of other configurations overlaps those described above with reference to FIGS. 9 through 19B, and is thus omitted.

Figure 21:
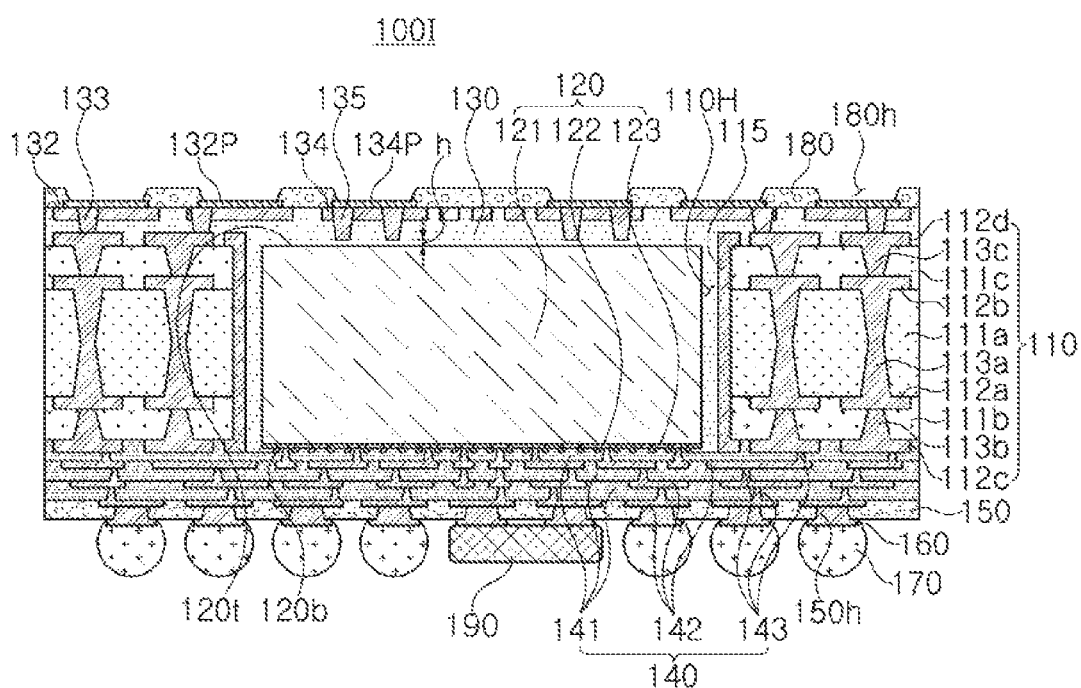
FIG. 21 is a schematic cross-sectional view illustrating a fan-out semiconductor package according to another exemplary embodiment in the present disclosure.

FIG. 21 is a schematic cross-sectional view illustrating a fan-out semiconductor package according to another exemplary embodiment in the present disclosure.

Referring to FIG. 21, a fan-out semiconductor package 100I according to another exemplary embodiment in the present disclosure may be different from the fan-out semiconductor package 100G according to another exemplary embodiment described above in that a frame 110 includes a first insulating layer 111a, a first wiring layer 112a and a second wiring layer 112b disposed on a lower surface and an upper surface of the first insulating layer 111a, respectively, a second insulating layer 111b disposed on the lower surface of the first insulating layer 111a and covering the first wiring layer 112a, a third wiring layer 112c disposed on a lower surface of the second insulating layer 111b, a third insulating layer 111c disposed on the upper surface of the first insulating layer 111a and covering the second wiring layer 112b, and a fourth wiring layer 112d disposed on an upper surface of the third insulating layer 111c. The first to fourth wiring layers 112a, 112b, 112c, and 112d may be electrically connected to each other through first to third wiring vias 113a, 113b, and 113c respectively penetrating through the first to third insulating layers 111a, 111b, and 111c. The fan-out semiconductor package 100F may further include a metal layer 115 disposed on walls of the frame 110. A description of other configurations overlaps those described above with reference to FIGS. 9 through 20, and is thus omitted.

As set forth above, according to an exemplary embodiment in the present disclosure, a fan-out semiconductor package in which heat dissipation characteristics may be excellent, a warpage problem and a reliability problem may be solved, and process costs may be reduced may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip having an active surface, having connection pads disposed thereon, and an inactive surface, opposing the active surface;
   an encapsulant covering the inactive surface of the semiconductor chip;
   a thermally conductive via penetrating through at least a portion of the encapsulant on the inactive surface of the semiconductor chip and physically spaced apart from the inactive surface of the semiconductor chip;
   a thermally conductive pattern layer disposed on the encapsulant and connected to the thermally conductive via;
   a cover layer disposed on the encapsulant and having openings opening at least portions of the thermally conductive pattern layer disposed facing the inactive surface, the openings exposing a portion of side surfaces of the cover layer; and
   a connection structure disposed on the active surface of the semiconductor chip and including a redistribution layer electrically connected to the connection pads,
   wherein the openings are not filled.

2. The semiconductor package of claim 1, wherein the encapsulant fills at least portions of a region in which the inactive surface of the semiconductor chip and the thermally conductive via are physically spaced apart from each other.

3. The semiconductor package of claim 1, wherein the inactive surface of the semiconductor chip and the thermally conductive via are physically spaced apart from each other only by a portion of the encapsulant filling between the inactive surface of the semiconductor chip and the thermally conductive via.

4. The semiconductor package of claim 1, wherein a distance by which the inactive surface of the semiconductor chip and the thermally conductive via are physically spaced apart from each other is 1 µm to 5 µm.

5. The semiconductor package of claim 1, wherein the thermally conductive via has a tapered shape of which a width of a cross section becomes narrow toward the inactive surface of the semiconductor chip.

6. The semiconductor package of claim 1, wherein the thermally conductive via includes a layer formed of only a metal.

7. The semiconductor package of claim 1, wherein the thermally conductive pattern layer protrudes from the encapsulant.

8. The semiconductor package of claim 1, wherein the thermally conductive pattern layer is disposed to directly face the inactive surface.

9. The semiconductor package of claim 1, wherein the thermally conductive via and the thermally conductive pattern layer are integrated with each other without having a boundary therebetween.

10. The semiconductor package of claim 1, wherein the thermally conductive pattern layer is embedded in the encapsulant, and has one surface exposed from the encapsulant.

11. The semiconductor package of claim 10, wherein an upper surface of the thermally conductive pattern layer and an upper surface of the encapsulant are substantially coplanar with each other.

12. The semiconductor package of claim 10, wherein the thermally conductive pattern layer is disposed to directly face the inactive surface.

13. The semiconductor package of claim 10, wherein the thermally conductive via penetrates through the thermally conductive pattern layer.

14. The semiconductor package of claim 1, further comprising a frame having a through-hole,
wherein the semiconductor chip is disposed in the through-hole,
the encapsulant covers at least portions of the frame, and
the encapsulant fills at least portions of the through-hole.

15. The semiconductor package of claim 14, wherein the frame includes a plurality of wiring layers,
the plurality of wiring layers are electrically connected to the connection pads,
a wiring pattern layer is disposed on or in the encapsulant, and
the wiring pattern layer is electrically connected to an uppermost wiring layer of the plurality of wiring layers through a wiring via penetrating through at least a portion of the encapsulant.

16. The semiconductor package of claim 14, wherein the frame includes a first insulating layer in contact with the connection structure, a first wiring layer embedded in the first insulating layer and in contact with the connection structure, a second wiring layer disposed on the other surface of the first insulating layer opposing one surface of the first insulating layer in which the first wiring layer is embedded, a second insulating layer disposed on the first insulating layer and covering the second wiring layer, and a third wiring layer disposed on the second insulating layer, and
the first to third wiring layers are electrically connected to the connection pads.

17. The semiconductor package of claim 16, wherein the frame further includes a third insulating layer disposed on the second insulating layer and covering the third wiring layer and a fourth wiring layer disposed on the third insulating layer, and
the fourth wiring layer is electrically connected to the connection pads.

18. The semiconductor package of claim 14, wherein the frame includes a first insulating layer, a first wiring layer disposed on one surface of the first insulating layer, a second wiring layer disposed on the other surface of the first insulating layer, a second insulating layer disposed on one surface of the first insulating layer and covering the first wiring layer, a third wiring layer disposed on the second insulating layer, a third insulating layer disposed on the other surface of the first insulating layer and covering the second wiring layer, and a fourth wiring layer disposed on the third insulating layer, and
the first to fourth wiring layers are electrically connected to the connection pads.

19. The semiconductor package of claim 1, wherein a thermal conductivity of the encapsulant is about 0.6 W/m° C. to 0.8 W/m° C.

20. The semiconductor package of claim 1, wherein a thermal conductivity of the encapsulant is greater than that of an insulating layer of the connection structure.

21. A semiconductor package comprising:
a semiconductor chip having an active surface, having connection pads disposed thereon, and an inactive surface, opposing the active surface;
an encapsulant layer covering the semiconductor chip;
a thermally conductive via penetrating into the encapsulant layer and spaced apart from the semiconductor chip only by a portion of the encapsulant layer disposed between the thermally conductive via and the semiconductor chip;
a thermally conductive pattern layer connected to the thermally conductive via;
a cover layer disposed on the encapsulant layer and having openings opening at least portions of the thermally conductive pattern layer;
a surface treatment layer disposed on opened surfaces of the thermally conductive pattern layer, a thickest portion of the surface treatment layer being less than a thickest portion of the cover layer; and
a connection structure disposed on the active surface of the semiconductor chip and including a redistribution layer electrically connected to the connection pads.

22. The semiconductor package of claim 21, wherein a distance by which the semiconductor chip and the thermally conductive via are spaced apart from each other is 5 µm or less.

23. The semiconductor package of claim 21, wherein the thermally conductive via has a tapered shape of which a width of a cross section becomes narrow toward the semiconductor chip.

24. The semiconductor package of claim 21,
wherein the thermally conductive via extends from the thermally conductive pattern layer towards the semiconductor chip.

25. The semiconductor package of claim 24, wherein the thermally conductive pattern layer protrudes on the encapsulant layer.

26. The semiconductor package of claim 21, wherein
the thermally conductive pattern layer is embedded in the encapsulant layer and has one surface exposed from the encapsulant layer.

27. The semiconductor package of claim 21, further comprising a frame having a through-hole,
wherein the semiconductor chip is disposed in the through-hole, and
the encapsulant layer extends from the inactive surface of the semiconductor chip to fill at least portions of the through-hole.

28. The semiconductor package of claim 21, wherein a thermal conductivity of the encapsulant layer is about 0.6 W/m° C. to 0.8 W/m° C.

* * * * *